(12) United States Patent
Sathyamurthy et al.

(10) Patent No.: US 12,089,374 B2
(45) Date of Patent: Sep. 10, 2024

(54) MEMS-BASED ACTIVE COOLING SYSTEMS

(71) Applicant: Frore Systems Inc., San Jose, CA (US)

(72) Inventors: Prabhu Sathyamurthy, San Jose, CA (US); Suryaprakash Ganti, Los Altos, CA (US); Seshagiri Rao Madhavapeddy, La Jolla, CA (US); Lumaya Ahmed, Sunnyvale, CA (US); Shekhar Halakatti, Campbell, CA (US)

(73) Assignee: Frore Systems Inc., San Jose, CA (US)

( * ) Notice: Subject to any disclaimer, the term of this patent is extended or adjusted under 35 U.S.C. 154(b) by 0 days.

(21) Appl. No.: 17/683,228

(22) Filed: Feb. 28, 2022

(65) Prior Publication Data

US 2022/0189852 A1 Jun. 16, 2022

Related U.S. Application Data

(63) Continuation-in-part of application No. 17/154,970, filed on Jan. 21, 2021, now Pat. No. 11,735,496, and
(Continued)

(51) Int. Cl.
*H05K 7/20* (2006.01)
*B06B 1/06* (2006.01)
(Continued)

(52) U.S. Cl.
CPC ............. *H05K 7/2039* (2013.01); *B06B 1/06* (2013.01); *H01L 23/427* (2013.01); *H01L 23/433* (2013.01); *H10N 30/20* (2023.02)

(58) Field of Classification Search
CPC ............. H05K 7/20509; H05K 7/2039; B81B 7/0093; H01L 41/042; H01L 41/047;
(Continued)

(56) References Cited

U.S. PATENT DOCUMENTS 4,251,031 A 2/1981 Martin
4,450,505 A 5/1984 Mittal
(Continued)

FOREIGN PATENT DOCUMENTS

CN 101032718 9/2007
CN 101718235 6/2010
(Continued)

OTHER PUBLICATIONS

H.Q. Li, "A High Frequency High Flow Rate Piezoelectrically Driven Mems Micropump", Solid-State Sensors, Actuators, and Microsystems Workshop, Jun. 4-8, 2000, pp. 69~72.
(Continued)

*Primary Examiner* — Anatoly Vortman
(74) *Attorney, Agent, or Firm* — Van Pelt, Yi & James LLP

(57) ABSTRACT

A cooling system including a heat spreader and a cooling element is described. The heat spreader is thermally coupled with a heat-generating structure. The cooling element is in fluid communication heat spreader. The heat-generating structure is offset from the cooling element. The cooling element undergoes vibrational motion when actuated to drive a fluid toward the heat spreader while not directing the fluid directly at the heat-generating structure.

19 Claims, 14 Drawing Sheets

Related U.S. Application Data a continuation-in-part of application No. 16/915,912, filed on Jun. 29, 2020, now Pat. No. 11,464,140, said application No. 17/154,970 is a continuation of application No. 16/369,766, filed on Mar. 29, 2019, now Pat. No. 10,943,850.

(60) Provisional application No. 63/277,494, filed on Nov. 9, 2021, provisional application No. 63/220,371, filed on Jul. 9, 2021, provisional application No. 63/155,721, filed on Mar. 2, 2021, provisional application No. 62/945,001, filed on Dec. 6, 2019, provisional application No. 62/717,474, filed on Aug. 10, 2018.

(51) Int. Cl.
*F04B 43/04* (2006.01)
*H01L 23/427* (2006.01)
*H01L 23/433* (2006.01)
*H01L 23/46* (2006.01)
*H10N 30/20* (2023.01)

(58) Field of Classification Search
CPC ..... H01L 23/427; H01L 23/433; H01L 41/09; B06B 1/06
USPC ......................................................... 361/704
See application file for complete search history.

(56) References Cited

U.S. PATENT DOCUMENTS

| | | | |
|---|---|---|---|
| 4,595,338 A | 6/1986 | Kolm | |
| 4,667,877 A | 5/1987 | Yao | |
| 4,751,713 A | 6/1988 | Affleck | |
| 4,780,062 A | 10/1988 | Yamada | |
| 4,834,619 A | 5/1989 | Walton | |
| 4,923,000 A | 5/1990 | Nelson | |
| 5,008,582 A | 4/1991 | Tanuma | |
| 5,673,171 A | 9/1997 | Varghese | |
| 5,758,823 A | 6/1998 | Glezer | |
| 5,796,152 A | 8/1998 | Carr | |
| 5,821,962 A | 10/1998 | Kudo | |
| 5,861,703 A | 1/1999 | Losinski | |
| 6,211,598 B1 | 4/2001 | Dhuler | |
| 6,232,680 B1 | 5/2001 | Bae | |
| 6,450,773 B1 | 9/2002 | Upton | |
| 6,483,419 B1 | 11/2002 | Weaver | |
| 6,498,725 B2 | 12/2002 | Cole | |
| 6,531,947 B1 | 3/2003 | Weaver | |
| 6,570,750 B1 | 5/2003 | Calcatera | |
| 6,588,497 B1* | 7/2003 | Glezer | H01L 23/467 165/84 |
| 6,598,960 B1 | 7/2003 | Cabal | |
| 6,612,816 B1 | 9/2003 | Vanden Brande | |
| 6,650,542 B1 | 11/2003 | Chrysler | |
| 6,713,942 B2 | 3/2004 | Raman | |
| 6,771,158 B2 | 8/2004 | Lee | |
| 6,853,068 B1 | 2/2005 | Djekic | |
| 6,876,047 B2 | 4/2005 | Cunningham | |
| 6,996,441 B1 | 2/2006 | Tobias | |
| 7,023,697 B2* | 4/2006 | Pokharna | H05K 1/0203 361/720 |
| 7,031,155 B2* | 4/2006 | Sauciuc | H01L 23/467 257/722 |
| 7,081,699 B2 | 7/2006 | Keolian | |
| 7,258,464 B2* | 8/2007 | Morris | F21V 29/15 362/264 |
| 7,282,837 B2 | 10/2007 | Scher | |
| 7,321,184 B2 | 1/2008 | Lee | |
| 7,324,323 B2 | 1/2008 | Aksyuk | |
| 7,420,807 B2 | 9/2008 | Mikubo | |
| 7,492,076 B2 | 2/2009 | Heim | |
| 7,516,776 B2 | 4/2009 | Bezama | |
| 7,553,135 B2 | 6/2009 | Cho | |
| 7,714,433 B2 | 5/2010 | Campini | |
| 7,742,299 B2* | 6/2010 | Sauciuc | H05K 7/20163 361/720 |
| 7,972,124 B2 | 7/2011 | Hirata | |
| 8,051,905 B2 | 11/2011 | Arik | |
| 8,289,701 B2* | 10/2012 | Suzuki | G06F 1/203 361/679.55 |
| 8,297,947 B2 | 10/2012 | Van Rensburg | |
| 8,308,453 B2 | 11/2012 | Yamamoto | |
| 8,308,454 B2 | 11/2012 | Kamitani | |
| 8,520,383 B2* | 8/2013 | Park | F28F 13/02 361/679.48 |
| 8,520,384 B2* | 8/2013 | Park | H01L 23/467 361/679.48 |
| 8,659,896 B2 | 2/2014 | Dede | |
| 8,678,787 B2 | 3/2014 | Hirata | |
| 8,684,707 B2 | 4/2014 | Kanai | |
| 8,736,139 B2 | 5/2014 | Lee | |
| 8,899,944 B2 | 12/2014 | Kanai | |
| 8,934,240 B2 | 1/2015 | Yu | |
| 9,179,575 B1 | 11/2015 | Yao | |
| 9,215,520 B2 | 12/2015 | De Bock | |
| 9,252,069 B2 | 2/2016 | Bhunia | |
| 9,466,452 B1 | 10/2016 | Liu | |
| 9,523,367 B2 | 12/2016 | Lucas | |
| 9,846,461 B2 | 12/2017 | Tang | |
| 9,976,547 B2 | 5/2018 | Tanaka | |
| 10,045,461 B1 | 8/2018 | Boozer | |
| 10,288,192 B2 | 5/2019 | Han | |
| 10,364,910 B2 | 7/2019 | Han | |
| 10,480,502 B2 | 11/2019 | Hirata | |
| 10,788,034 B2* | 9/2020 | Ganti | B06B 1/06 |
| 10,943,850 B2* | 3/2021 | Ganti | F04B 53/08 |
| 11,043,444 B2* | 6/2021 | Ganti | F04D 33/00 |
| 11,242,241 B2 | 2/2022 | Menon | |
| 11,454,232 B2 | 9/2022 | Mou et al. | |
| 11,456,234 B2 | 9/2022 | Ganti | |
| 11,466,674 B2 | 10/2022 | Chang | |
| 2002/0163782 A1 | 11/2002 | Cole | |
| 2002/0184907 A1 | 12/2002 | Vaiyapuri | |
| 2004/0023614 A1 | 2/2004 | Koplin | |
| 2004/0190251 A1 | 9/2004 | Prasher | |
| 2004/0196999 A1 | 10/2004 | Han | |
| 2004/0218362 A1 | 11/2004 | Amaro | |
| 2004/0244405 A1 | 12/2004 | Kim | |
| 2004/0253130 A1 | 12/2004 | Sauciuc | |
| 2005/0074662 A1 | 4/2005 | Cho | |
| 2005/0089415 A1 | 4/2005 | Cho | |
| 2005/0110841 A1 | 5/2005 | Silverbrook | |
| 2005/0178529 A1 | 8/2005 | Suzuki | |
| 2005/0211418 A1 | 9/2005 | Kenny | |
| 2005/0225213 A1 | 10/2005 | Richards | |
| 2005/0266286 A1 | 12/2005 | Sato | |
| 2005/0280994 A1 | 12/2005 | Yazawa | |
| 2006/0147324 A1 | 7/2006 | Tanner | |
| 2006/0164805 A1 | 7/2006 | Meinders | |
| 2006/0181848 A1* | 8/2006 | Kiley | F28D 15/0275 361/709 |
| 2006/0208613 A1 | 9/2006 | Scher | |
| 2006/0232167 A1 | 10/2006 | Jordan | |
| 2006/0236710 A1 | 10/2006 | Vaiyapuri | |
| 2006/0250773 A1 | 11/2006 | Campbell | |
| 2006/0250774 A1 | 11/2006 | Campbell | |
| 2006/0260784 A1 | 11/2006 | Bezama | |
| 2006/0268534 A1 | 11/2006 | Paydar | |
| 2007/0020124 A1 | 1/2007 | Singhal | |
| 2007/0037506 A1 | 2/2007 | Lee | |
| 2007/0048154 A1 | 3/2007 | Sapir | |
| 2007/0076375 A1 | 4/2007 | Mongia | |
| 2007/0235180 A1 | 10/2007 | Ouyang | |
| 2007/0274045 A1 | 11/2007 | Campbell | |
| 2008/0041574 A1 | 2/2008 | Arik | |
| 2008/0101965 A1 | 5/2008 | Zhang | |
| 2008/0111866 A1 | 5/2008 | Silverbrook | |
| 2008/0218972 A1 | 9/2008 | Sauciuc | |
| 2008/0304979 A1 | 12/2008 | Lucas | |
| 2009/0021908 A1 | 1/2009 | Patel | |
| 2009/0034197 A1 | 2/2009 | Leija | |

(56) References Cited

U.S. PATENT DOCUMENTS

| | | |
|---|---|---|
| 2009/0050294 A1 | 2/2009 | Fedorov |
| 2009/0085438 A1 | 4/2009 | Chrysler |
| 2009/0120621 A1 | 5/2009 | Sheinman |
| 2009/0148320 A1 | 6/2009 | Lucas |
| 2009/0167109 A1 | 7/2009 | Tomita |
| 2009/0174999 A1 | 7/2009 | Sauciuc |
| 2009/0232683 A1 | 9/2009 | Hirata |
| 2009/0232684 A1 | 9/2009 | Hirata |
| 2009/0232685 A1 | 9/2009 | Kamitani |
| 2010/0067191 A1 | 3/2010 | Arik |
| 2010/0073431 A1 | 3/2010 | Silverbrook |
| 2010/0074775 A1 | 3/2010 | Yamamoto |
| 2011/0063800 A1 | 3/2011 | Park |
| 2011/0068685 A1 | 3/2011 | Maeng |
| 2011/0068799 A1 | 3/2011 | Wolf |
| 2011/0096125 A1 | 4/2011 | Silverbrook |
| 2011/0122582 A1 | 5/2011 | Park |
| 2011/0211020 A1 | 9/2011 | Silverbrook |
| 2011/0259557 A1 | 10/2011 | Chao |
| 2011/0277491 A1 | 11/2011 | Wu |
| 2011/0304240 A1 | 12/2011 | Meitav |
| 2012/0063091 A1 | 3/2012 | Dede |
| 2012/0171062 A1 | 7/2012 | Kodama |
| 2012/0301333 A1 | 11/2012 | Smirnov |
| 2013/0058818 A1 | 3/2013 | Hirata |
| 2013/0071269 A1 | 3/2013 | Fujisaki |
| 2013/0157729 A1 | 6/2013 | Tabe |
| 2013/0225065 A1 | 8/2013 | Lee |
| 2013/0233523 A1 | 9/2013 | Parida |
| 2014/0052429 A1 | 2/2014 | Kelkar |
| 2014/0192485 A1 | 7/2014 | Rau |
| 2014/0216696 A1 | 8/2014 | Donnelly |
| 2015/0007965 A1 | 1/2015 | Joshi |
| 2015/0009631 A1 | 1/2015 | Joshi |
| 2015/0043164 A1 | 2/2015 | Joshi |
| 2015/0173237 A1 | 6/2015 | Lin |
| 2015/0308377 A1 | 10/2015 | Packard |
| 2016/0025429 A1 | 1/2016 | Muir |
| 2016/0076530 A1 | 3/2016 | Chen |
| 2016/0353186 A1 | 12/2016 | Rothkopf |
| 2016/0358841 A1 | 12/2016 | Eid |
| 2016/0377072 A1 | 12/2016 | Wu |
| 2016/0377073 A1 | 12/2016 | Tanaka |
| 2017/0146039 A1 | 5/2017 | Lin |
| 2017/0222123 A1 | 8/2017 | Chen |
| 2017/0276149 A1 | 9/2017 | Dusseau |
| 2017/0292537 A1 | 10/2017 | Barak |
| 2017/0363076 A1 | 12/2017 | Najafi |
| 2018/0061737 A1 | 3/2018 | Arik |
| 2018/0145010 A1 | 5/2018 | Fukuoka |
| 2018/0146573 A1 | 5/2018 | Chen |
| 2018/0146574 A1 | 5/2018 | Chen |
| 2018/0187672 A1 | 7/2018 | Tanaka |
| 2018/0240734 A1 | 8/2018 | Liao |
| 2019/0062150 A1 | 2/2019 | Moitzi |
| 2019/0067550 A1 | 2/2019 | Mou |
| 2019/0085836 A1 | 3/2019 | Mou |
| 2019/0101938 A1 | 4/2019 | Mou |
| 2019/0128252 A1 | 5/2019 | Mou et al. |
| 2019/0301442 A1 | 10/2019 | Hao |
| 2019/0309744 A1 | 10/2019 | Ting |
| 2020/0049143 A1 | 2/2020 | Ganti |
| 2020/0049386 A1 | 2/2020 | Ganti |
| 2020/0049387 A1 | 2/2020 | Ganti et al. |
| 2020/0049388 A1 | 2/2020 | Ganti et al. |
| 2020/0051895 A1 | 2/2020 | Ganti |
| 2020/0053905 A1 | 2/2020 | Ganti |
| 2020/0088185 A1 | 3/2020 | Mou |
| 2020/0229320 A1 | 7/2020 | Mou |
| 2020/0309111 A1 | 10/2020 | Mou et al. |
| 2021/0131415 A1 | 5/2021 | Yalamarthy |
| 2021/0144884 A1 | 5/2021 | Mou |
| 2021/0176894 A1 | 6/2021 | Yalamarthy |
| 2021/0176895 A1 | 6/2021 | Mukundan |
| 2021/0180723 A1 | 6/2021 | Mukundan |
| 2021/0183739 A1 | 6/2021 | Sathyamurthy |
| 2021/0185853 A1 | 6/2021 | Ganti |
| 2021/0185856 A1 | 6/2021 | Ganti |
| 2022/0081284 A1 | 3/2022 | Ganti |
| 2022/0087058 A1 | 3/2022 | Sankar |
| 2022/0087064 A1 | 3/2022 | Ganti |
| 2022/0120269 A1 | 4/2022 | Mou et al. |
| 2022/0150335 A1 | 5/2022 | Sathyamurthy |
| 2022/0187033 A1 | 6/2022 | Sankar |
| 2022/0189852 A1 | 6/2022 | Sathyamurthy |
| 2022/0282932 A1 | 9/2022 | Sathyamurthy |

FOREIGN PATENT DOCUMENTS

| | | |
|---|---|---|
| CN | 101785103 | 7/2010 |
| CN | 103828050 | 5/2014 |
| CN | 204436756 | 7/2015 |
| CN | 104832407 | 8/2015 |
| CN | 106206490 | 12/2016 |
| CN | 106849747 | 6/2017 |
| CN | 107642483 | 1/2018 |
| CN | 207287973 | 5/2018 |
| CN | 109641738 | 4/2019 |
| CN | 113898563 | 4/2022 |
| EP | 3290211 | 3/2018 |
| JP | 69152793 | 8/1984 |
| JP | S62149158 | 9/1987 |
| JP | S62199999 | 9/1987 |
| JP | H04065862 | 3/1992 |
| JP | H07263598 | 10/1995 |
| JP | 09246766 | 9/1997 |
| JP | 2000323882 | 11/2000 |
| JP | 2001119181 | 4/2001 |
| JP | 2002130198 | 5/2002 |
| JP | 2008159688 | 7/2008 |
| JP | 2008525709 | 7/2008 |
| JP | 2008263830 | 11/2008 |
| JP | 2010029759 | 2/2010 |
| JP | 2011144743 | 7/2011 |
| JP | 2013223818 | 10/2013 |
| JP | 2018022868 | 2/2018 |
| JP | 2018085510 | 5/2018 |
| JP | 2018085511 | 5/2018 |
| JP | 2018085512 | 5/2018 |
| JP | 6528849 | 6/2019 |
| KR | 20050026992 | 3/2005 |
| KR | 100594802 | 7/2006 |
| KR | 20070063029 | 6/2007 |
| TW | 200635493 | 10/2006 |
| TW | 201638469 | 11/2016 |
| TW | 542326 | 5/2017 |
| TW | 201814772 | 4/2018 |
| WO | 2014024608 | 2/2014 |

OTHER PUBLICATIONS

Murata Manufacturing Co., Ltd., Microblower MZB1001T02, Microblower (Air Pump), Micro Mechatronics, Apr. 2014, downloaded from: https://www.murata.com/en-us/products/mechatronics/fluid/microblower_mzb1001t02.

Liu et al., Application Prospects of Microfluidics Technology in Electronic Chip Cooling Research, Cryo & Supercond, vol. 37, No. 9, Sep. 16, 2009.

* cited by examiner

MEMS-BASED ACTIVE COOLING SYSTEMS

CROSS REFERENCE TO OTHER APPLICATIONS

This application is a continuation in part of U.S. patent application Ser. No. 17/154,970 entitled PIEZOELECTRIC MEMS-BASED ACTIVE COOLING FOR HEAT DISSIPATION IN COMPUTE DEVICES filed Jan. 21, 2021, which is a continuation of U.S. patent application Ser. No. 16/369,766, now U.S. Pat. No. 10,943,850, entitled PIEZOELECTRIC MEMS-BASED ACTIVE COOLING FOR HEAT DISSIPATION IN COMPUTE DEVICES filed Mar. 29, 2019, which claims priority to U.S. Provisional Patent Application No. 62/717,474 entitled PIEZO ELECTRIC MEMS-BASED ACTIVE COOLING FOR HEAT DISSIPATION IN COMPUTE DEVICES filed Aug. 10, 2018, all of which are incorporated herein by reference for all purposes.

This application is a continuation in part of U.S. patent application Ser. No. 16/915,912 entitled CENTRALLY ANCHORED MEMS-BASED ACTIVE COOLING SYSTEMS filed Jun. 29, 2020, which claims priority to U.S. Provisional Patent Application No. 62/945,001 entitled CENTRALLY ANCHORED MEMS-BASED ACTIVE COOLING SYSTEMS filed Dec. 6, 2019, both of which are incorporated herein by reference for all purposes.

This application claims priority to U.S. Provisional Patent Application No. 63/155,721 entitled MOUNTING AND USE OF PIEZOELECTRIC COOLING SYSTEMS IN DEVICES filed Mar. 2, 2021, U.S. Provisional Patent Application No. 63/220,371 entitled MEMS-BASED ACTIVE COOLING SYSTEMS INCLUDING COOLING CELL ARRANGEMENT, TABS, ANCHOR BONDING, INTEGRATED SPREADER, ADHESIVE, AND POWER MANAGEMENT filed Jul. 9, 2021, and U.S. Provisional Patent Application No. 63/277,494 entitled INTEGRATION OF AIRJETS INTO COMPUTING DEVICES filed Nov. 9, 2021, all of which are incorporated herein by reference for all purposes.

BACKGROUND OF THE INVENTION

As computing devices grow in speed and computing power, the heat generated by the computing devices also increases. Various mechanisms have been proposed to address the generation of heat. Active devices, such as fans, may be used to drive air through large computing devices, such as laptop computers or desktop computers. Passive cooling devices, such as heat spreaders, may be used in smaller, mobile computing devices, such as smartphones, virtual reality devices and tablet computers. However, such active and passive devices may be unable to adequately cool both mobile devices such as smartphones and larger devices such as laptops and desktop computers. Moreover, incorporating cooling solutions into computing devices may be challenging. Consequently, additional cooling solutions for computing devices are desired.

BRIEF DESCRIPTION OF THE DRAWINGS

Various embodiments of the invention are disclosed in the following detailed description and the accompanying drawings.

DETAILED DESCRIPTION

Figure 1A:
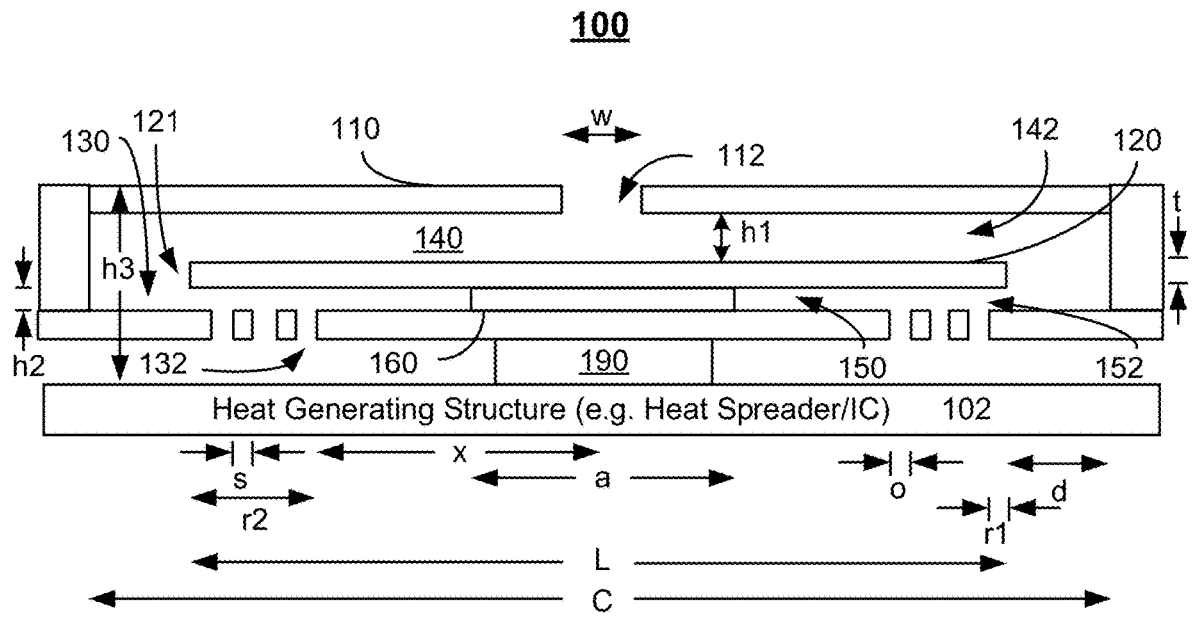
FIGS. 1A-1G depict an embodiment of an active MEMS cooling system including a centrally anchored cooling element.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

As semiconductor devices become increasingly powerful, the heat generated during operations also grows. For example, processors for mobile devices such as smartphones, tablet computers, notebook computers, and virtual reality devices as well as for other computing devices such as servers, can operate at high clock speeds, but produce a significant amount of heat. Because of the quantity of heat produced, processors may run at full speed only for a relatively short period of time. After this time expires, throttling (e.g. slowing of the processor's clock speed) occurs. Although throttling can reduce heat generation, it also adversely affects processor speed and, therefore, the performance of devices using the processors. As technology moves to 5G and beyond, this issue is expected to be exacerbated. Further, other components in a computing device may generate heat. Thus, thermal management is increasingly an issue for computing devices.

A cooling system including a heat spreader and a cooling element is described. The heat spreader is thermally coupled with a heat-generating structure. The cooling element is in fluid communication heat spreader. The heat-generating structure is offset from the cooling element. The cooling element undergoes vibrational motion when actuated to drive a fluid toward the heat spreader while not directing the fluid directly at the heat-generating structure. In some embodiments, the heat spreader and the cooling element have a combined thickness of less than three millimeters. The heat spreader and the cooling element may have a combined thickness of less than two millimeters.

In some embodiments, the cooling system further includes a support structure. In such embodiments, the cooling element has a central region and a perimeter. The cooling element is supported by the support structure at the central region. At least a portion of the perimeter is unpinned. The cooling system may also include a top plate having at least one vent therein. The cooling element is between the top plate and the heat spreader. A top chamber is formed between the cooling element and the top plate. The cooling system may also include an orifice plate having at least one orifice therein. The orifice plate is disposed between the cooling element and the heat-generating structure. The cooling element is actuated to drive the fluid through the orifice(s). In some such embodiments, the top chamber has a length corresponding to an odd integer multiplied by a wavelength divided by four. The wavelength is an acoustic wavelength for a frequency of the vibrational motion. The frequency of the vibrational motion corresponds to a structural resonance for the cooling element and to an acoustic resonance for the top chamber having the wavelength.

A system is described. The system includes a heat spreader and an active cooling system. The heat spreader is thermally coupled with a heat-generating structure. The active cooling system includes a plurality of active cooling cells. Each of the active cooling cells includes a cooling element. The active cooling system is in thermal communication with the heat spreader. The cooling element undergoes vibrational motion when actuated to drive a fluid toward the heat spreader while not directing the fluid directly at the heat-generating structure. A combined thickness of the heat spreader and the active cooling system does not exceed four millimeters. The heat-generating structure is offset from the active cooling system. In some embodiments, the heat spreader and the active cooling system have a combined thickness of less than three millimeters. In some embodiments, the heat spreader and the active cooling system have a combined thickness of less than two millimeters.

In some embodiments, each active cooling cell further includes a support structure. The cooling element has a central region and a perimeter. The cooling element is supported by the support structure at the central region. At least a portion of the perimeter is unpinned. Each active cooling cell may further include a top plate having at least one vent therein. The cooling element is between the top plate and the heat spreader. A top chamber is between the cooling element and the top plate. Each active cooling cell may also include an orifice plate having at least one orifice therein. The orifice plate is disposed between the cooling element and the heat-generating structure. The cooling element is actuated to drive the fluid through the orifice(s). In some embodiments, the top chamber has a length corresponding to an odd integer multiplied by a wavelength divided by four. The wavelength is an acoustic wavelength for a frequency of the vibrational motion. The frequency of the vibrational motion corresponds to a structural resonance for the cooling element and to an acoustic resonance for the top chamber having the wavelength.

A method is described. The method includes driving a cooling element to induce a vibrational motion at a frequency. The vibrational motion drives a fluid toward a heat spreader that is in thermal communication with a heat-generating structure. The heat-generating structure is offset from the cooling element. In some embodiments, the frequency corresponds to a structural resonant frequency of the cooling element and an acoustic resonant frequency for the cooling element. In some embodiments, the cooling element is part of a cooling system that also includes a support structure. The cooling element has a central region and a perimeter. The cooling element is supported by the support structure at the central region. At least a portion of the perimeter is unpinned. In some embodiments, the heat spreader and the cooling element have a combined thickness of less than three millimeters. In some such embodiments, the heat spreader and the cooling element have a combined thickness of less than two millimeters.

Figure 1B:
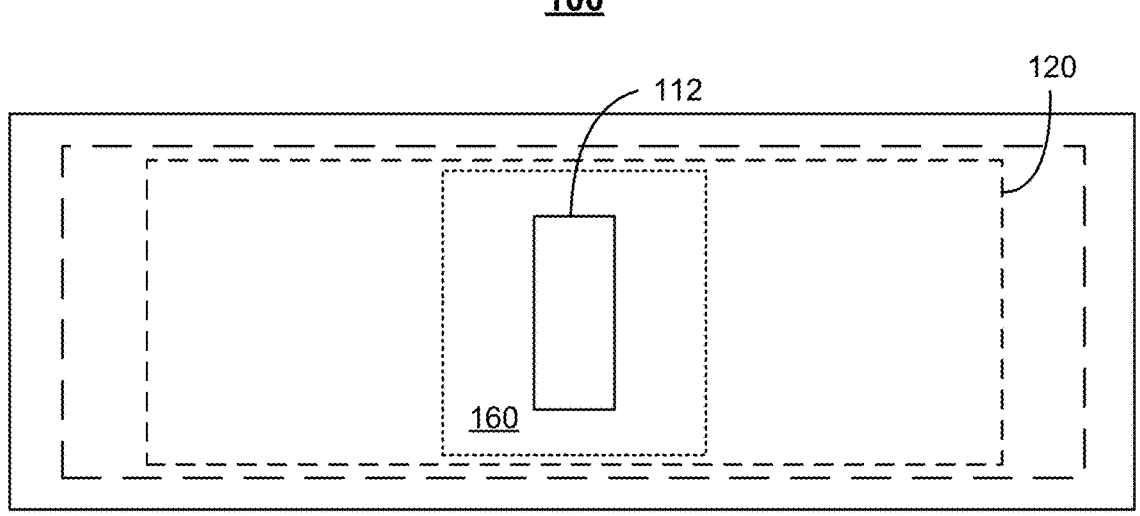
Figure 1C:
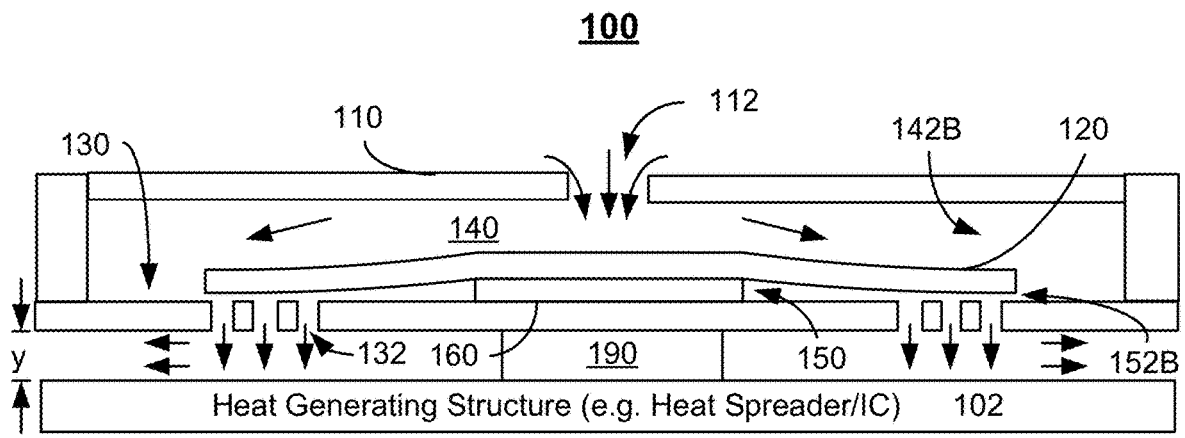
Figure 1D:
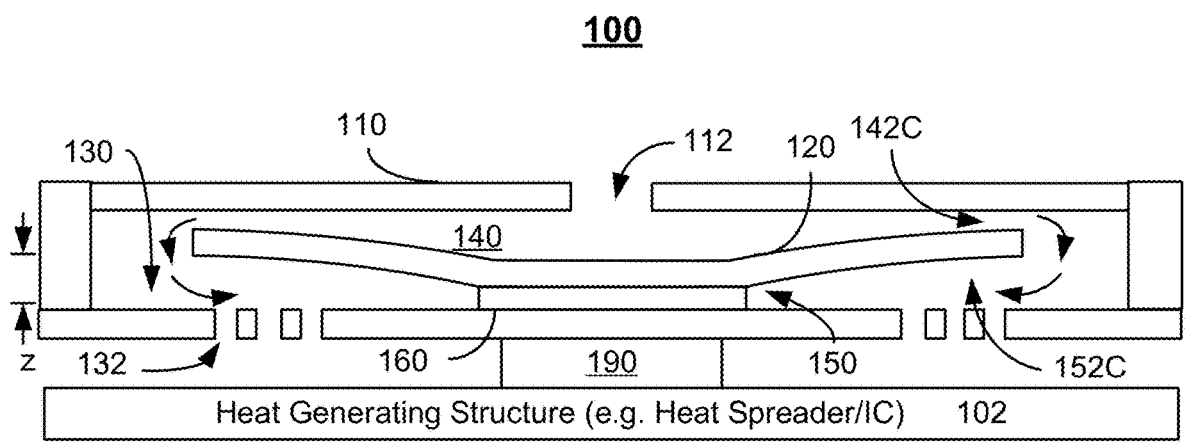
Figure 1E:
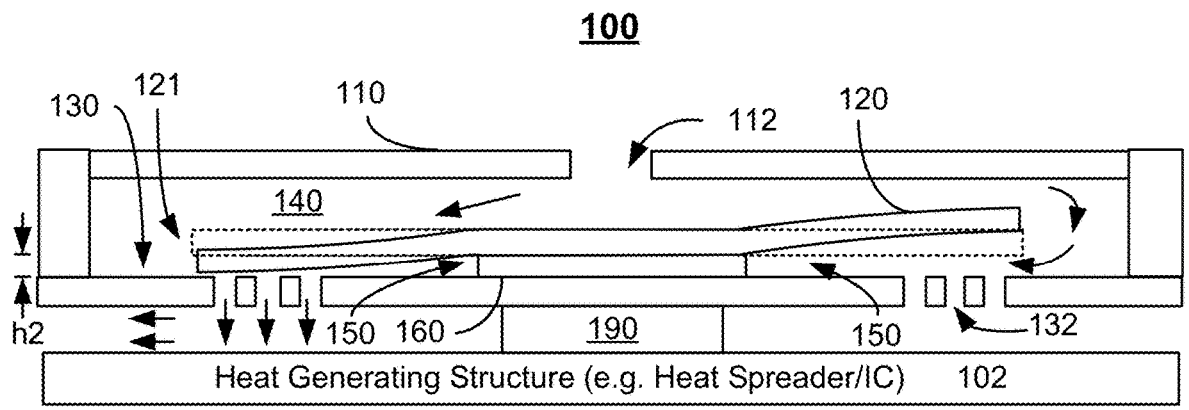
Figure 1F:
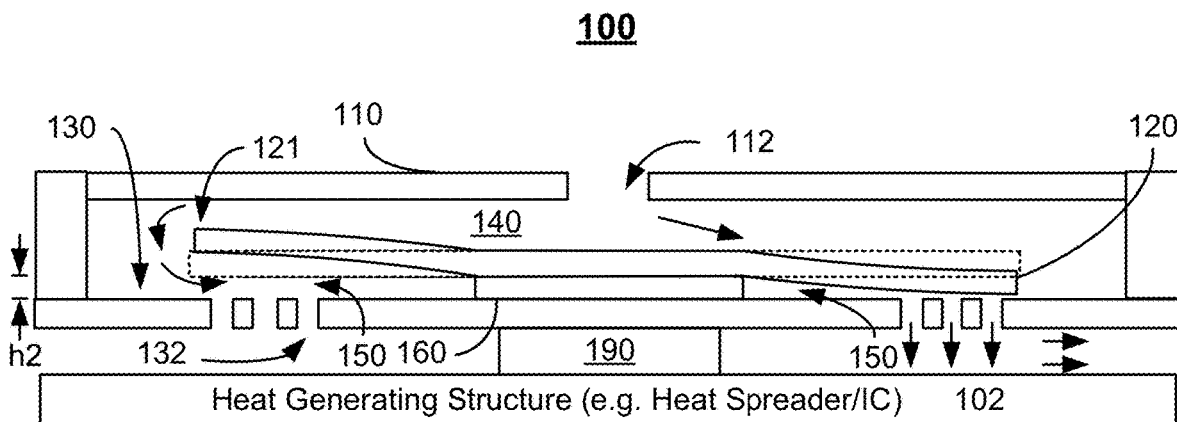
Figure 1G:
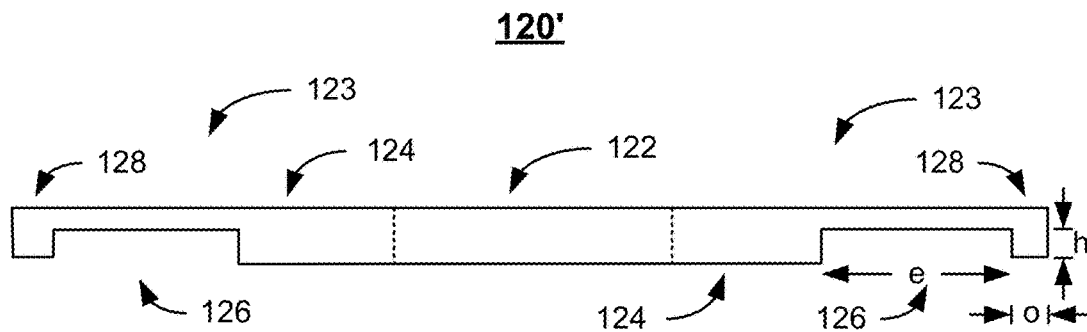

FIGS. 1A-1G are diagrams depicting an exemplary embodiment of active MEMS cooling system 100 usable with heat-generating structure 102 and including a centrally anchored cooling element 120 or 120'. Cooling element 120 is shown in FIGS. 1A-1F and cooling element 120' is shown in FIG. 1G. For clarity, only certain components are shown. FIGS. 1A-1G are not to scale. FIGS. 1A and 1B depict cross-sectional and top views of cooling system 100 in a neutral position. FIGS. 1C-1D depict cooling system 100 during actuation for in-phase vibrational motion. FIGS. 1E-1F depict cooling system 100 during actuation for out-of-phase vibrational motion. Although shown as symmetric, cooling system 100 need not be.

Cooling system 100 includes top plate 110 having vent 112 therein, cooling element 120, orifice plate 130 having orifices 132 therein, support structure (or "anchor") 160 and chambers 140 and 150 (collectively chamber 140/150) formed therein. Cooling element 120 is supported at its central region by anchor 160. Regions of cooling element 120 closer to and including portions of the cooling element's perimeter (e.g. tip 121) vibrate when actuated. In some embodiments, tip 121 of cooling element 120 includes a portion of the perimeter furthest from anchor 160 and undergoes the largest deflection during actuation of cooling element 120. For clarity, only one tip 121 of cooling element 120 is labeled in FIG. 1A. Also shown is pedestal 190 that connects orifice plate 130 to and offsets orifice plate 130 from heat-generating structure 102. In some embodiments, pedestal 190 also thermally couples orifice plate 130 to heat-generating structure 102.

FIG. 1A depicts cooling system 100 in a neutral position. Thus, cooling element 120 is shown as substantially flat. For in-phase operation, cooling element 120 is driven to vibrate between positions shown in FIGS. 1C and 1D. This vibrational motion draws fluid (e.g. air) into vent 112, through chambers 140 and 150 and out orifices 132 at high speed and/or flow rates. For example, the speed at which the fluid impinges on heat-generating structure 102 may be at least thirty meters per second. In some embodiments, the fluid is driven by cooling element 120 toward heat-generating structure 102 at a speed of at least forty-five meters per second. In some embodiments, the fluid is driven toward heat-generating structure 102 by cooling element 120 at speeds of at least sixty meters per second. Other speeds may be possible in some embodiments. Cooling system 100 is also configured so that little or no fluid is drawn back into chamber 140/150 through orifices 132 by the vibrational motion of cooling element 120.

Heat-generating structure 102 is desired to be cooled by cooling system 100. In some embodiments, heat-generating structure 102 generates heat. For example, heat-generating structure may be an integrated circuit. In some embodiments, heat-generating structure 102 is desired to be cooled but does not generate heat itself. Heat-generating structure 102 may conduct heat (e.g. from a nearby object that generates heat). For example, heat-generating structure 102 might be a heat spreader or a vapor chamber. Thus, heat-generating structure 102 may include semiconductor component(s) including individual integrated circuit components such as processors, other integrated circuit(s) and/or chip package(s); sensor(s); optical device(s); one or more batteries; other component(s) of an electronic device such as a computing device; heat spreaders; heat pipes; other electronic component(s) and/or other device(s) desired to be cooled. In some embodiments, heat-generating structure 102 may be a thermally conductive part of a module containing cooling system 100. For example, cooling system 100 may be affixed to heat-generating structure 102, which may be coupled to another heat sink, vapor chamber, integrated circuit, or other separate structure desired to be cooled.

The devices in which cooling system 100 is desired to be used may also have limited space in which to place a cooling system. For example, cooling system 100 may be used in computing devices. Such computing devices may include but are not limited to smartphones, tablet computers, laptop computers, tablets, two-in-one laptops, hand held gaming systems, digital cameras, virtual reality headsets, augmented reality headsets, mixed reality headsets and other devices that are thin. Cooling system 100 may be a micro-electro-mechanical system (MEMS) cooling system capable of residing within mobile computing devices and/or other devices having limited space in at least one dimension. For example, the total height, h3, of cooling system 100 (from the top of heat-generating structure 102 to the top of top plate 110) may be less than 2 millimeters. In some embodiments, the total height of cooling system 100 is not more than 1.5 millimeters. In some embodiments, this total height is not more than 1.1 millimeters. In some embodiments, the total height does not exceed one millimeter. In some embodiments, the total height does not exceed two hundred and fifty micrometers. Similarly, the distance between the bottom of orifice plate 130 and the top of heat-generating structure 102, y, may be small. In some embodiments, y is at least two hundred micrometers and not more than 1.2 millimeter. For example, y may be at least two hundred and fifty micrometers and not more than three hundred micrometers. In some embodiments, y is at least five hundred micrometers and not more than one millimeter. In some embodiments, y is at least two hundred micrometers and not more than three hundred micrometers. Thus, cooling system 100 is usable in computing devices and/or other devices having limited space in at least one dimension. However, nothing prevents the use of cooling system 100 in devices having fewer limitations on space and/or for purposes other than cooling. Although one cooling system 100 is shown (e.g. one cooling cell), multiple cooling systems 100 might be used in connection with heat-generating structure 102. For example, a one or two-dimensional array of cooling cells might be utilized.

Cooling system 100 is in communication with a fluid used to cool heat-generating structure 102. The fluid may be a gas or a liquid. For example, the fluid may be air. In some embodiments, the fluid includes fluid from outside of the device in which cooling system 100 resides (e.g. provided through external vents in the device). In some embodiments, the fluid circulates within the device in which cooling system resides (e.g. in an enclosed device).

Cooling element 120 can be considered to divide the interior of active MEMS cooling system 100 into top chamber 140 and bottom chamber 150. Top chamber 140 is formed by cooling element 120, the sides, and top plate 110. Bottom chamber 150 is formed by orifice plate 130, the sides, cooling element 120 and anchor 160. Top chamber 140 and bottom chamber 150 are connected at the periphery of cooling element 120 and together form chamber 140/150 (e.g. an interior chamber of cooling system 100).

The size and configuration of top chamber 140 may be a function of the cell (cooling system 100) dimensions, cooling element 120 motion, and the frequency of operation. Top chamber 140 has a height, h1. The height of top chamber 140 may be selected to provide sufficient pressure to drive the fluid to bottom chamber 150 and through orifices 132 at the desired flow rate and/or speed. Top chamber 140 is also sufficiently tall that cooling element 120 does not contact top plate 110 when actuated. In some embodiments, the height of top chamber 140 is at least fifty micrometers and not more than five hundred micrometers. In some embodiments, top chamber 140 has a height of at least two hundred and not more than three hundred micrometers.

Bottom chamber 150 has a height, h2. In some embodiments, the height of bottom chamber 150 is sufficient to accommodate the motion of cooling element 120. Thus, no portion of cooling element 120 contacts orifice plate 130 during normal operation. Bottom chamber 150 is generally smaller than top chamber 140 and may aid in reducing the backflow of fluid into orifices 132. In some embodiments, the height of bottom chamber 150 is the maximum deflection of cooling element 120 plus at least five micrometers and not more than ten micrometers. In some embodiments, the deflection of cooling element 120 (e.g. the deflection of tip 121), z, has an amplitude of at least ten micrometers and not more than one hundred micrometers. In some such embodiments, the amplitude of deflection of cooling element 120 is at least ten micrometers and not more than sixty micrometers. However, the amplitude of deflection of cooling element 120 depends on factors such as the desired flow rate through cooling system 100 and the configuration of cooling system 100. Thus, the height of bottom chamber 150 generally depends on the flow rate through and other components of cooling system 100.

Top plate 110 includes vent 112 through which fluid may be drawn into cooling system 100. Top vent 112 may have a size chosen based on the desired acoustic pressure in chamber 140. For example, in some embodiments, the width, w, of vent 112 is at least five hundred micrometers and not more than one thousand micrometers. In some embodiments, the width of vent 112 is at least two hundred fifty micrometers and not more than two thousand micrometers. In the embodiment shown, vent 112 is a centrally located aperture in top plate 110. In other embodiments, vent 112 may be located elsewhere. For example, vent 112 may be closer to one of the edges of top plate 110. Vent 112 may have a circular, rectangular or other shaped footprint. Although a single vent 112 is shown, multiple vents might be used. For example, vents may be offset toward the edges of top chamber 140 or be located on the side(s) of top chamber 140. Although top plate 110 is shown as substantially flat, in some embodiments trenches and/or other structures may be provided in top plate 110 to modify the configuration of top chamber 140 and/or the region above top plate 110.

Anchor (support structure) 160 supports cooling element 120 at the central portion of cooling element 120. Thus, at least part of the perimeter of cooling element 120 is unpinned and free to vibrate. In some embodiments, anchor 160 extends along a central axis of cooling element 120 (e.g. perpendicular to the page in FIGS. 1A-1F). In such embodiments, portions of cooling element 120 that vibrate (e.g. including tip 121) move in a cantilevered fashion. Thus, portions of cooling element 120 may move in a manner analogous to the wings of a butterfly (i.e. in phase) and/or analogous to a seesaw (i.e. out of phase). Thus, the portions of cooling element 120 that vibrate in a cantilevered fashion do so in phase in some embodiments and out of phase in other embodiments. In some embodiments, anchor 160 does not extend along an axis of cooling element 120. In such embodiments, all portions of the perimeter of cooling element 120 are free to vibrate (e.g. analogous to a jellyfish). In the embodiment shown, anchor 160 supports cooling element 120 from the bottom of cooling element 120. In other embodiments, anchor 160 may support cooling element 120 in another manner. For example, anchor 160 may support cooling element 120 from the top (e.g. cooling element 120 hangs from anchor 160). In some embodiments, the width, a, of anchor 160 is at least 0.5 millimeters and not more than four millimeters. In some embodiments, the width of anchor 160 is at least two millimeters and not more than 2.5 millimeters. Anchor 160 may occupy at least ten percent and not more than fifty percent of cooling element 120.

Cooling element 120 has a first side distal from heat-generating structure 102 and a second side proximate to heat-generating structure 102. In the embodiment shown in FIGS. 1A-1F, the first side of cooling element 120 is the top of cooling element 120 (closer to top plate 110) and the second side is the bottom of cooling element 120 (closer to orifice plate 130). Cooling element 120 is actuated to undergo vibrational motion as shown in FIGS. 1A-1F. The vibrational motion of cooling element 120 drives fluid from the first side of cooling element 120 distal from heat-generating structure 102 (e.g. from top chamber 140) to a second side of cooling element 120 proximate to heat-generating structure 102 (e.g. to bottom chamber 150). The vibrational motion of cooling element 120 also draws fluid through vent 112 and into top chamber 140; forces fluid from top chamber 140 to bottom chamber 150; and drives fluid from bottom chamber 150 through orifices 132 of orifice plate 130. Thus, cooling element 120 may be viewed as an actuator. Although described in the context of a single, continuous cooling element, in some embodiments, cooling element 120 may be formed by two (or more) cooling elements. Each of the cooling elements as one portion pinned (e.g. supported by support structure 160) and an opposite portion unpinned. Thus, a single, centrally supported cooling element 120 may be formed by a combination of multiple cooling elements supported at an edge.

Cooling element 120 has a length, L, that depends upon the frequency at which cooling element 120 is desired to vibrate. In some embodiments, the length of cooling element 120 is at least four millimeters and not more than ten millimeters. In some such embodiments, cooling element 120 has a length of at least six millimeters and not more than eight millimeters. The depth of cooling element 120 (e.g. perpendicular to the plane shown in FIGS. 1A-1F) may vary from one fourth of L through twice L. For example, cooling element 120 may have the same depth as length. The thickness, t, of cooling element 120 may vary based upon the configuration of cooling element 120 and/or the frequency at which cooling element 120 is desired to be actuated. In some embodiments, the cooling element thickness is at least two hundred micrometers and not more than three hundred and fifty micrometers for cooling element 120 having a length of eight millimeters and driven at a frequency of at least twenty kilohertz and not more than twenty-five kilohertz. The length, C of chamber 140/150 is close to the length, L, of cooling element 120. For example, in some embodiments, the distance, d, between the edge of cooling element 120 and the wall of chamber 140/150 is at least one hundred micrometers and not more than five hundred micrometers. In some embodiments, d is at least two hundred micrometers and not more than three hundred micrometers.

Cooling element 120 may be driven at a frequency that is at or near both the resonant frequency for an acoustic resonance of a pressure wave of the fluid in top chamber 140 and the resonant frequency for a structural resonance of cooling element 120. The portion of cooling element 120 undergoing vibrational motion is driven at or near resonance (the "structural resonance") of cooling element 120. This portion of cooling element 120 undergoing vibration may be a cantilevered section in some embodiments. The frequency of vibration for structural resonance is termed the structural resonant frequency. Use of the structural resonant frequency in driving cooling element 120 reduces the power consumption of cooling system 100. Cooling element 120 and top chamber 140 may also be configured such that this structural resonant frequency corresponds to a resonance in a pressure wave in the fluid being driven through top chamber 140 (the acoustic resonance of top chamber 140). The frequency of such a pressure wave is termed the acoustic resonant frequency. At acoustic resonance, a node in pressure occurs near vent 112 and an antinode in pressure occurs near the periphery of cooling system 100 (e.g. near tip 121 of cooling element 120 and near the connection between top chamber 140 and bottom chamber 150). The distance between these two regions is C/2. Thus, $C/2 = n\lambda/4$, where $\lambda$ is the acoustic wavelength for the fluid and n is odd (e.g. n=1, 3, 5, etc.). For the lowest order mode, $C = \lambda/2$. Because the length of chamber 140 (e.g. C) is close to the length of cooling element 120, in some embodiments, it is also approximately true that $L/2 = n\lambda/4$, where $\lambda$ is the acoustic wavelength for the fluid and n is odd. Thus, the frequency at which cooling element 120 is driven, v, is at or near the structural resonant frequency for cooling element 120. The frequency v is also at or near the acoustic resonant frequency for at least top chamber 140. The acoustic resonant frequency of top chamber 140 generally varies less dramatically with parameters such as temperature and size than the structural resonant frequency of cooling element 120. Consequently, in some embodiments, cooling element 120 may be driven at (or closer to) a structural resonant frequency than to the acoustic resonant frequency.

Orifice plate 130 has orifices 132 therein. Although a particular number and distribution of orifices 132 are shown, another number and/or another distribution may be used. A single orifice plate 130 is used for a single cooling system 100. In other embodiments, multiple cooling systems 100 may share an orifice plate. For example, multiple cells 100 may be provided together in a desired configuration. In such embodiments, the cells 100 may be the same size and configuration or different size(s) and/or configuration(s). Orifices 132 are shown as having an axis oriented normal to a surface of heat-generating structure 102. In other embodiments, the axis of one or more orifices 132 may be at another angle. For example, the angle of the axis may be selected from substantially zero degrees and a nonzero acute angle. Orifices 132 also have sidewalls that are substantially parallel to the normal to the surface of orifice plate 130. In some embodiments, orifices may have sidewalls at a nonzero angle to the normal to the surface of orifice plate 130. For example, orifices 132 may be cone-shaped. Further, although orifice place 130 is shown as substantially flat, in some embodiments, trenches and/or other structures may be provided in orifice plate 130 to modify the configuration of bottom chamber 150 and/or the region between orifice plate 130 and heat-generating structure 102.

The size, distribution and locations of orifices 132 are chosen to control the flow rate of fluid driven to the surface of heat-generating structure 102. The locations and configurations of orifices 132 may be configured to increase/maximize the fluid flow from bottom chamber 150 through orifices 132 to the jet channel (the region between the bottom of orifice plate 130 and the top of heat-generating structure 102). The locations and configurations of orifices 132 may also be selected to reduce/minimize the suction flow (e.g. back flow) from the jet channel through orifices 132. For example, the locations of orifices are desired to be sufficiently far from tip 121 that suction in the upstroke of cooling element 120 (tip 121 moves away from orifice plate 13) that would pull fluid into bottom chamber 150 through orifices 132 is reduced. The locations of orifices are also desired to be sufficiently close to tip 121 that suction in the upstroke of cooling element 120 also allows a higher pressure from top chamber 140 to push fluid from top chamber 140 into bottom chamber 150. In some embodiments, the ratio of the flow rate from top chamber 140 into bottom chamber 150 to the flow rate from the jet channel through orifices 132 in the upstroke (the "net flow ratio") is greater than 2:1. In some embodiments, the net flow ratio is at least 85:15. In some embodiments, the net flow ratio is at least 90:10. In order to provide the desired pressure, flow rate, suction, and net flow ratio, orifices 132 are desired to be at least a distance, r1, from tip 121 and not more than a distance, r2, from tip 121 of cooling element 120. In some embodiments r1 is at least one hundred micrometers (e.g. r1≥100 µm) and r2 is not more than one millimeter (e.g. r2≤1000 µm). In some embodiments, orifices 132 are at least two hundred micrometers from tip 121 of cooling element 120 (e.g. r1≥200 µm). In some such embodiments, orifices 132 are at least three hundred micrometers from tip 121 of cooling element 120 (e.g. r1≥300 µm). In some embodiments, orifices 132 have a width, o, of at least one hundred micrometers and not more than five hundred micrometers. In some embodiments, orifices 132 have a width of at least two hundred micrometers and not more than three hundred micrometers. In some embodiments, the orifice separation, s, is at least one hundred micrometers and not more than one millimeter. In some such embodiments, the orifice separation is at least four hundred micrometers and not more than six hundred micrometers. In some embodiments, orifices 132 are also desired to occupy a particular fraction of the area of orifice plate 130. For example, orifices 132 may cover at least five percent and not more than fifteen percent of the footprint of orifice plate 130 in order to achieve a desired flow rate of fluid through orifices 132. In some embodiments, orifices 132 cover at least eight percent and not more than twelve percent of the footprint of orifice plate 130.

In some embodiments, cooling element 120 is actuated using a piezoelectric. Thus, cooling element 120 may be a piezoelectric cooling element. Cooling element 120 may be driven by a piezoelectric that is mounted on or integrated into cooling element 120. In some embodiments, cooling element 120 is driven in another manner including but not limited to providing a piezoelectric on another structure in cooling system 100. Cooling element 120 and analogous cooling elements are referred to hereinafter as piezoelectric cooling element though it is possible that a mechanism other than a piezoelectric might be used to drive the cooling element. In some embodiments, cooling element 120 includes a piezoelectric layer on substrate. The substrate may include or consist of stainless steel, a Ni alloy, Hastelloy, Al (e.g. an Al alloy), and/or a Ti (e.g. a Ti alloy such as Ti6Al-4V). In some embodiments, piezoelectric layer includes multiple sublayers formed as thin films on the substrate. In other embodiments, the piezoelectric layer may be a bulk layer affixed to the substrate. Such a piezoelectric cooling element 120 also includes electrodes used to activate the piezoelectric. The substrate functions as an electrode in some embodiments. In other embodiments, a bottom electrode may be provided between the substrate and the piezoelectric layer. Other layers including but not limited to seed, capping, passivation or other layers might be included in piezoelectric cooling element. Thus, cooling element 120 may be actuated using a piezoelectric.

In some embodiments, cooling system 100 includes chimneys (not shown) or other ducting. Such ducting provides a path for heated fluid to flow away from heat-generating structure 102. In some embodiments, ducting returns fluid to the side of top plate 110 distal from heat-generating structure 102. In some embodiments, ducting may instead direct fluid away from heat-generating structure 102 in a direction parallel to heat-generating structure 102 or perpendicular to heat-generating structure 102 but in the opposite direction (e.g. toward the bottom of the page). For a device in which fluid external to the device is used in cooling system 100, the ducting may channel the heated fluid to a vent. In such embodiments, additional fluid may be provided from an inlet vent. In embodiments, in which the device is enclosed, the ducting may provide a circuitous path back to the region near vent 112 and distal from heat-generating structure 102. Such a path allows for the fluid to dissipate heat before being reused to cool heat-generating structure 102. In other embodiments, ducting may be omitted or configured in another manner. Thus, the fluid is allowed to carry away heat from heat-generating structure 102.

Operation of cooling system 100 is described in the context of FIGS. 1A-1F. Although described in the context of particular pressures, gap sizes, and timing of flow, operation of cooling system 100 is not dependent upon the explanation herein. FIGS. 1C-1D depict in-phase operation of cooling system 100. Referring to FIG. 1C, cooling element 120 has been actuated so that its tip 121 moves away from top plate 110. FIG. 1C can thus be considered to depict the end of a down stroke of cooling element 120. Because of the vibrational motion of cooling element 120, gap 152 for bottom chamber 150 has decreased in size and is shown as gap 152B. Conversely, gap 142 for top chamber 140 has increased in size and is shown as gap 142B. During the down stroke, a lower (e.g. minimum) pressure is developed at the periphery when cooling element 120 is at the neutral position. As the down stroke continues, bottom chamber 150 decreases in size and top chamber 140 increases in size as shown in FIG. 1C. Thus, fluid is driven out of orifices 132 in a direction that is at or near perpendicular to the surface of orifice plate 130 and/or the top surface of heat-generating structure 102. The fluid is driven from orifices 132 toward heat-generating structure 102 at a high speed, for example in excess of thirty-five meters per second. In some embodiments, the fluid then travels along the surface of heat-generating structure 102 and toward the periphery of heat-generating structure 102, where the pressure is lower than near orifices 132. Also in the down stroke, top chamber 140 increases in size and a lower pressure is present in top chamber 140. As a result, fluid is drawn into top chamber 140 through vent 112. The motion of the fluid into vent 112, through orifices 132, and along the surface of heat-generating structure 102 is shown by unlabeled arrows in FIG. 1C.

Cooling element 120 is also actuated so that tip 121 moves away from heat-generating structure 102 and toward top plate 110. FIG. 1D can thus be considered to depict the end of an up stroke of cooling element 120. Because of the motion of cooling element 120, gap 142 has decreased in size and is shown as gap 142C. Gap 152 has increased in size and is shown as gap 152C. During the upstroke, a higher (e.g. maximum) pressure is developed at the periphery when cooling element 120 is at the neutral position. As the upstroke continues, bottom chamber 150 increases in size and top chamber 140 decreases in size as shown in FIG. 1D. Thus, the fluid is driven from top chamber 140 (e.g. the periphery of chamber 140/150) to bottom chamber 150. Thus, when tip 121 of cooling element 120 moves up, top chamber 140 serves as a nozzle for the entering fluid to speed up and be driven towards bottom chamber 150. The motion of the fluid into bottom chamber 150 is shown by unlabeled arrows in FIG. 1D. The location and configuration of cooling element 120 and orifices 132 are selected to reduce suction and, therefore, back flow of fluid from the jet channel (between heat-generating structure 102 and orifice plate 130) into orifices 132 during the upstroke. Thus, cooling system 100 is able to drive fluid from top chamber 140 to bottom chamber 150 without an undue amount of backflow of heated fluid from the jet channel entering bottom chamber 140. Moreover, cooling system 100 may operate such that fluid is drawn in through vent 112 and driven out through orifices 132 without cooling element 120 contacting top plate 110 or orifice plate 130. Thus, pressures are developed within chambers 140 and 150 that effectively open and close vent 112 and orifices 132 such that fluid is driven through cooling system 100 as described herein.

The motion between the positions shown in FIGS. 1C and 1D is repeated. Thus, cooling element 120 undergoes vibrational motion indicated in FIGS. 1A-1D, drawing fluid through vent 112 from the distal side of top plate 110 into top chamber 140; transferring fluid from top chamber 140 to bottom chamber 150; and pushing the fluid through orifices 132 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at frequencies from 15 kHz through 30 kHz. In some embodiments, cooling element 120 vibrates at a frequency/frequencies of at least 20 kHz and not more than 30 kHz. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 may move substantially normal (perpendicular) to the top surface of heat-generating structure 102. In some embodiments, fluid motion may have a nonzero acute angle with respect to the normal to the top surface of heat-generating structure 102. In either case, the fluid may thin and/or form apertures in the boundary layer of fluid at heat-generating structure 102. As a result, transfer of heat from heat-generating structure 102 may be improved. The fluid deflects off of heat-generating structure 102, traveling along the surface of heat-generating structure 102. In some embodiments, the fluid moves in a direction substantially parallel to the top of heat-generating structure 102. Thus, heat from heat-generating structure 102 may be extracted by the fluid. The fluid may exit the region between orifice plate 130 and heat-generating structure 102 at the edges of cooling system 100. Chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to distal side of top plate 110 after cooling. In other embodiments, heated fluid is carried away and replaced by new fluid at the distal side of cooling element 120. As a result, heat-generating structure 102 may be cooled.

FIGS. 1E-1F depict an embodiment of active MEMS cooling system 100 including centrally anchored cooling element 120 in which the cooling element is driven out-of-phase. More specifically, sections of cooling element 120 on opposite sides of anchor 160 (and thus on opposite sides of the central region of cooling element 120 that is supported by anchor 160) are driven to vibrate out-of-phase. In some embodiments, sections of cooling element 120 on opposite sides of anchor 160 are driven at or near one hundred and eighty degrees out-of-phase. Thus, one section of cooling element 120 vibrates toward top plate 110, while the other section of cooling element 120 vibrates toward orifice plate 130/heat-generating structure 102. Movement of a section of cooling element 120 toward top plate 110 (an upstroke) drives fluid in top chamber 140 to bottom chamber 150 on that side of anchor 160. Movement of a section of cooling element 120 toward orifice plate 130 drives fluid through orifices 132 and toward heat-generating structure 102. Thus, fluid traveling at high speeds (e.g. speeds described with respect to in-phase operation) is alternately driven out of orifices 132 on opposing sides of anchor 160. Because fluid is driven through orifices 132 at high speeds, cooling system 100 may be viewed as a ME Ms jet. The movement of fluid is shown by unlabeled arrows in FIGS. 1E and 1F. The motion between the positions shown in FIGS. 1E and 1F is repeated. Thus, cooling element 120 undergoes vibrational motion indicated in FIGS. 1A, 1E, and 1F, alternately drawing fluid through vent 112 from the distal side of top plate 110 into top chamber 140 for each side of cooling element 120; transferring fluid from each side of top chamber 140 to the corresponding side of bottom chamber 150; and pushing the fluid through orifices 132 on each side of anchor 160 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at the frequencies described for in-phase vibration. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 for out-of-phase vibration may move substantially normal (perpendicular) to the top surface of heat-generating structure 102, in a manner analogous to that described above for in-phase operation. Similarly, chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to distal side of top plate 110 after cooling. In other embodiments, heated fluid is carried away and replaced by new fluid at the distal side of cooling element 120. As a result, heat-generating structure 102 may be cooled.

Although shown in the context of a uniform cooling element in FIGS. 1A-1F, cooling system 100 may utilize cooling elements having different shapes. FIG. 1G depicts an embodiment of engineered cooling element 120' having a tailored geometry and usable in a cooling system such as cooling system 100. Cooling element 120' includes an anchored region 122 and cantilevered arms 123. Anchored region 122 is supported (e.g. held in place) in cooling system 100 by anchor 160. Cantilevered arms 123 undergo vibrational motion in response to cooling element 120' being actuated. Each cantilevered arm 123 includes step region 124, extension region 126 and outer region 128. In the embodiment shown in FIG. 1G, anchored region 122 is centrally located. Step region 124 extends outward from anchored region 122. Extension region 126 extends outward from step region 124. Outer region 128 extends outward from extension region 126. In other embodiments, anchored region 122 may be at one edge of the actuator and outer region 128 at the opposing edge. In such embodiments, the actuator is edge anchored.

Extension region 126 has a thickness (extension thickness) that is less than the thickness of step region 124 (step thickness) and less than the thickness of outer region 128 (outer thickness). Thus, extension region 126 may be viewed as recessed. Extension region 126 may also be seen as providing a larger bottom chamber 150. In some embodiments, the outer thickness of outer region 128 is the same as the step thickness of step region 124. In some embodiments, the outer thickness of outer region 128 is different from the step thickness of step region 124. In some embodiments, outer region 128 and step region 124 each have a thickness of at least three hundred twenty micrometers and not more than three hundred and sixty micrometers. In some embodiments, the outer thickness is at least fifty micrometers and not more than two hundred micrometers thicker than the extension thickness. Stated differently, the step (difference in step thickness and extension thickness) is at least fifty micrometers and not more than two hundred micrometers. In some embodiments, the outer step (difference in outer thickness and extension thickness) is at least fifty micrometers and not more than two hundred micrometers. Outer region 128 may have a width, o, of at least one hundred micrometers and not more than three hundred micrometers. Extension region has a length, e, extending outward from the step region of at least 0.5 millimeter and not more than 1.5 millimeters in some embodiments. In some embodiments, outer region 128 has a higher mass per unit length in the direction from anchored region 122 than extension region 126. This difference in mass may be due to the larger size of outer region 128, a difference in density between portions of cooling element 120, and/or another mechanism.

Use of engineered cooling element 120' may further improve efficiency of cooling system 100. Extension region 126 is thinner than step region 124 and outer region 128. This results in a cavity in the bottom of cooling element 120' corresponding to extension region 126. The presence of this cavity aids in improving the efficiency of cooling system 100. Each cantilevered arm 123 vibrates towards top plate 110 in an upstroke and away from top plate 110 in a downstroke. When a cantilevered arm 123 moves toward top plate 110, higher pressure fluid in top chamber 140 resists the motion of cantilevered arm 123. Furthermore, suction in bottom chamber 150 also resists the upward motion of cantilevered arm 123 during the upstroke. In the downstroke of cantilevered arm 123, increased pressure in the bottom chamber 150 and suction in top chamber 140 resist the downward motion of cantilevered arm 123. However, the presence of the cavity in cantilevered arm 123 corresponding to extension region 126 mitigates the suction in bottom chamber 150 during an upstroke. The cavity also reduces the increase in pressure in bottom chamber 150 during a downstroke. Because the suction and pressure increase are reduced in magnitude, cantilevered arms 123 may more readily move through the fluid. This may be achieved while substantially maintaining a higher pressure in top chamber 140, which drives the fluid flow through cooling system 100. Moreover, the presence of outer region 128 may improve the ability of cantilevered arm 123 to move through the fluid being driven through cooling system 100. Outer region 128 has a higher mass per unit length and thus a higher momentum. Consequently, outer region 128 may improve the ability of cantilevered arms 123 to move through the fluid being driven through cooling system 100. The magnitude of the deflection of cantilevered arm 123 may also be increased. These benefits may be achieved while maintaining the stiffness of cantilevered arms 123 through the use of thicker step region 124. Further, the larger thickness of outer region 128 may aid in pinching off flow at the bottom of a downstroke. Thus, the ability of cooling element 120' to provide a valve preventing backflow through orifices 132 may be improved. Thus, performance of cooling system 100 employing cooling element 120' may be improved.

Further, cooling elements used in cooling system 100 may have different structures and/or be mounted differently than depicted in FIGS. 1A-1G. In some embodiments, the cooling element may have rounded corners and/or rounded ends but still be anchored along a central axis such that cantilevered arms vibrate. The cooling element may be anchored only at its central region such that the regions surrounding the anchor vibrate in a manner analogous to a jellyfish or the opening/closing of an umbrella. In some such embodiments, the cooling element may be circular or elliptical in shape. In some embodiments, the anchor may include apertures through which fluid may flow. Such an anchor may be utilized for the cooling element being anchored at its top (e.g. to the top plate). Although not indicated in FIGS. 1A-1G, the piezoelectric utilized in driving the cooling element may have various locations and/or configurations. For example, the piezoelectric may be embedded in the cooling element, affixed to one side of the cooling element (or cantilevered arm(s)), may occupy some or all of the cantilevered arms, and/or may have a location that is close to or distal from the anchored region. In some embodiments, cooling elements that are not centrally anchored may be used. For example, a pair of cooling elements that have offset apertures, that are anchored at their ends (or all edges), and which vibrate out of phase may be used. Thus, various additional configurations of cooling element 120 and/or 120', anchor 160, and/or other portions of cooling system 100 may be used.

Using the cooling system 100 actuated for in-phase vibration or out-of-phase vibration of cooling element 120 and/or 120', fluid drawn in through vent 112 and driven through orifices 132 may efficiently dissipate heat from heat-generating structure 102. Because fluid impinges upon the heat-generating structure with sufficient speed (e.g. at least thirty meters per second) and in some embodiments substantially normal to the heat-generating structure, the boundary layer of fluid at the heat-generating structure may be thinned and/or partially removed. Consequently, heat transfer between heat-generating structure 102 and the moving fluid is improved. Because the heat-generating structure is more efficiently cooled, the corresponding integrated circuit may be run at higher speed and/or power for longer times. For example, if the heat-generating structure corresponds to a high-speed processor, such a processor may be run for longer times before throttling. Thus, performance of a device utilizing cooling system 100 may be improved. Further, cooling system 100 may be a MEMS device. Consequently, cooling systems 100 may be suitable for use in smaller and/or mobile devices, such as smart phones, other mobile phones, virtual reality headsets, tablets, two-in-one computers, wearables and handheld games, in which limited space is available. Performance of such devices may thus be improved. Because cooling element 120/120' may be vibrated at frequencies of 15 kHz or more, users may not hear any noise associated with actuation of cooling elements. If driven at or near structural and/or acoustic resonant frequencies, the power used in operating cooling systems may be significantly reduced. Cooling element 120/120' does not physically contact top plate 110 or orifice plate 130 during vibration. Thus, resonance of cooling element 120/120' may be more readily maintained. More specifically, physical contact between cooling element 120/120' and other structures disturbs the resonance conditions for cooling element 120/120'. Disturbing these conditions may drive cooling element 120/120' out of resonance. Thus, additional power would need to be used to maintain actuation of cooling element 120/120'. Further, the flow of fluid driven by cooling element 120/120' may decrease. These issues are avoided through the use of pressure differentials and fluid flow as discussed above. The benefits of improved, quiet cooling may be achieved with limited additional power. Further, out-of-phase vibration of cooling element 120/120' allows the position of the center of mass of cooling element 100 to remain more stable. Although a torque is exerted on cooling element 120/120', the force due to the motion of the center of mass is reduced or eliminated. As a result, vibrations due to the motion of cooling element 120/120' may be reduced. Moreover, efficiency of cooling system 100 may be improved through the use of out-of-phase vibrational motion for the two sides of cooling element 120/120'. Consequently, performance of devices incorporating the cooling system 100 may be improved. Further, cooling system 100 may be usable in other applications (e.g. with or without heat-generating structure 102) in which high fluid flows and/or velocities are desired.

Figure 2A:
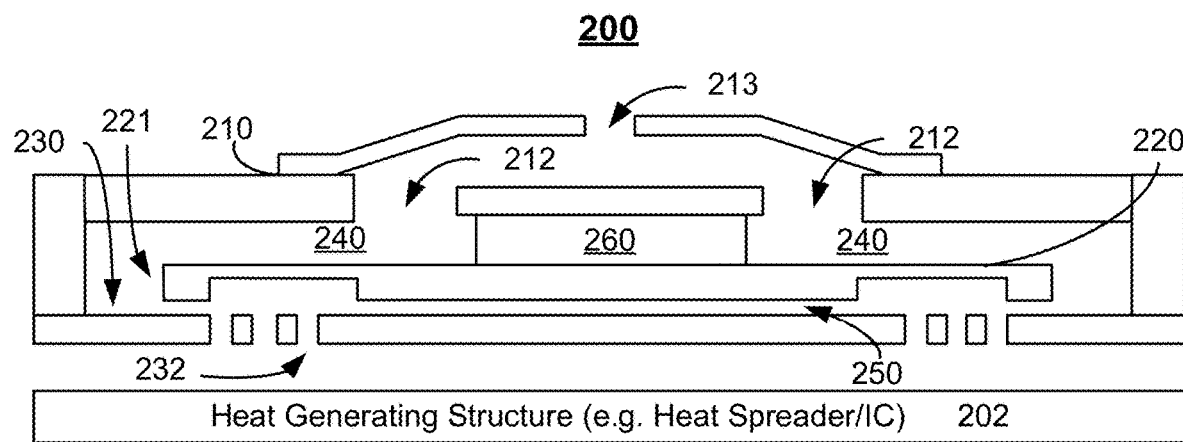
FIGS. 2A-2B depict an embodiment of an active MEMS cooling system including a centrally anchored cooling element.
Figure 2B:
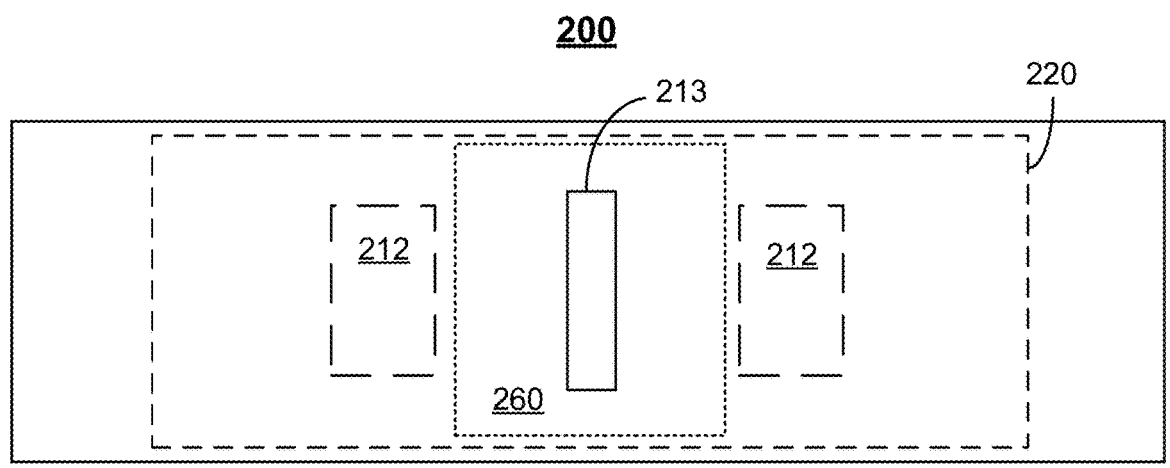

FIGS. 2A-2B depict an embodiment of active MEMS cooling system 200 including a top centrally anchored cooling element. FIG. 2A depicts a side view of cooling system 200 in a neutral position. FIG. 2B depicts a top view of cooling system 200. FIGS. 2A-2B are not to scale. For simplicity, only portions of cooling system 200 are shown. Referring to FIGS. 2A-2B, cooling system 200 is analogous to cooling system 100. Consequently, analogous components have similar labels. For example, cooling system 200 is used in conjunction with heat-generating structure 202, which is analogous to heat-generating structure 202.

Cooling system 200 includes top plate 210 having vents 212, cooling element 220 having tip 221, orifice plate 230 including orifices 232, top chamber 240 having a gap, bottom chamber 250 having a gap, flow chamber 240/250, and anchor (i.e. support structure) 260 that are analogous to top plate 110 having vent 112, cooling element 120 having tip 121, orifice plate 130 including orifices 132, top chamber 140 having gap 142, bottom chamber 150 having gap 152, flow chamber 140/150, and anchor (i.e. support structure) 160, respectively. Also shown is pedestal 290 that is analogous to pedestal 190. Thus, cooling element 220 is centrally supported by anchor 260 such that at least a portion of the perimeter of cooling element 220 is free to vibrate. In some embodiments, anchor 260 extends along the axis of cooling element 420. In other embodiments, anchor 460 is only near the center portion of cooling element 420. Although not explicitly labeled in FIGS. 2A and 2B, cooling element 220 includes an anchored region and cantilevered arms including step region, extension region and outer regions analogous to anchored region 122, cantilevered arms 123, step region 124, extension region 126 and outer region 128 of cooling element 120'. In some embodiments, cantilevered arms of cooling element 220 are driven in-phase. In some embodiments, cantilevered arms of cooling element 220 are driven out-of-phase. In some embodiments, a simple cooling element, such as cooling element 120, may be used.

Anchor 260 supports cooling element 220 from above. Thus, cooling element 220 is suspended from anchor 260. Anchor 260 is suspended from top plate 210. Top plate 210 includes vent 213. Vents 212 on the sides of anchor 260 provide a path for fluid to flow into sides of chamber 240.

As discussed above with respect to cooling system 100, cooling element 220 may be driven to vibrate at or near the structural resonant frequency of cooling element 220. Further, the structural resonant frequency of cooling element 220 may be configured to align with the acoustic resonance of the chamber 240/250. The structural and acoustic resonant frequencies are generally chosen to be in the ultrasonic range. For example, the vibrational motion of cooling element 220 may be at the frequencies described with respect to cooling system 100. Consequently, efficiency and flow rate may be enhanced. However, other frequencies may be used.

Cooling system 200 operates in an analogous manner to cooling system 100. Cooling system 200 thus shares the benefits of cooling system 100. Thus, performance of a device employing cooling system 200 may be improved. In addition, suspending cooling element 220 from anchor 260 may further enhance performance. In particular, vibrations in cooling system 200 that may affect other cooling cells (not shown), may be reduced. For example, less vibration may be induced in top plate 210 due to the motion of cooling element 220. Consequently, cross talk between cooling system 200 and other cooling systems (e.g. other cells) or other portions of the device incorporating cooling system 200 may be reduced. Thus, performance may be further enhanced.

Figure 3A:
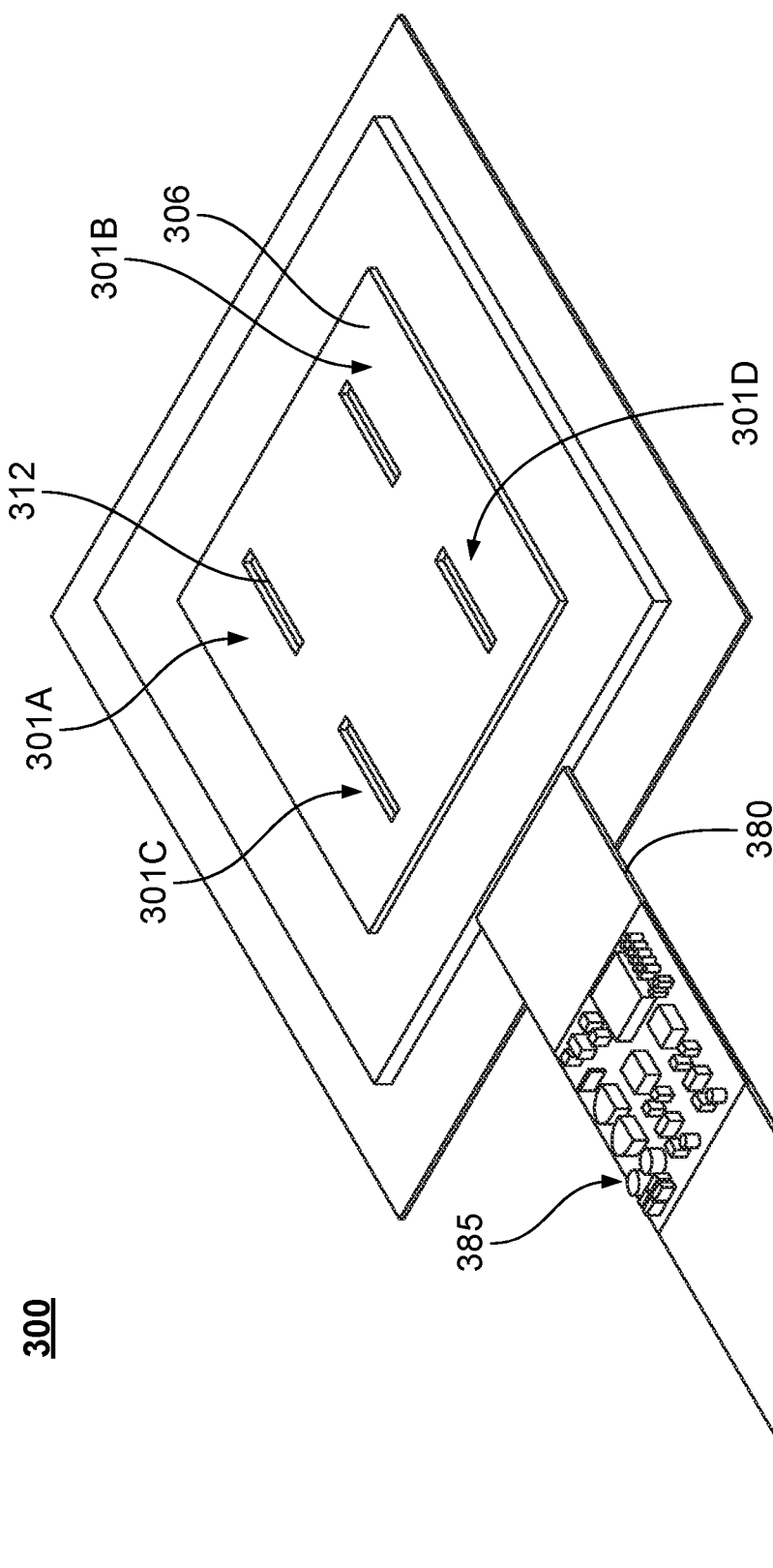
FIGS. 3A-3E depict an embodiment of an active MEMS cooling system formed in a tile.
Figure 3B:
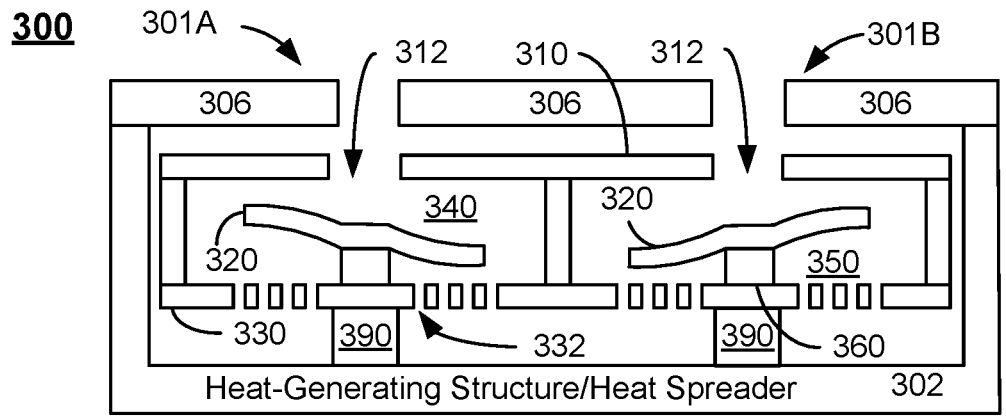
Figure 3C:
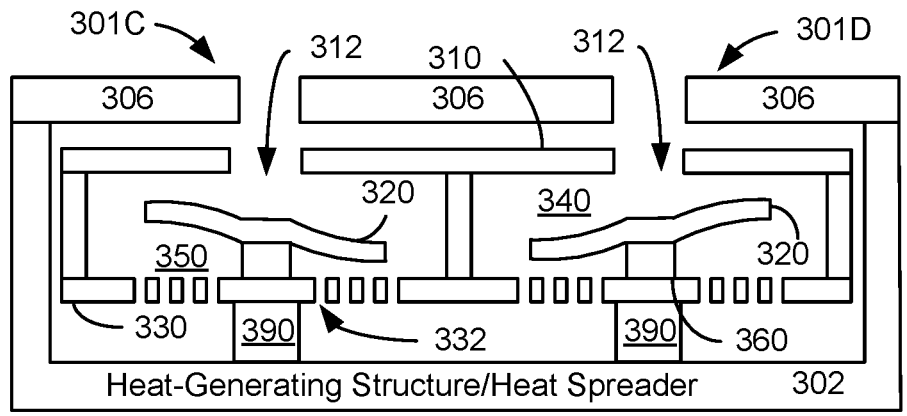
Figure 3D:
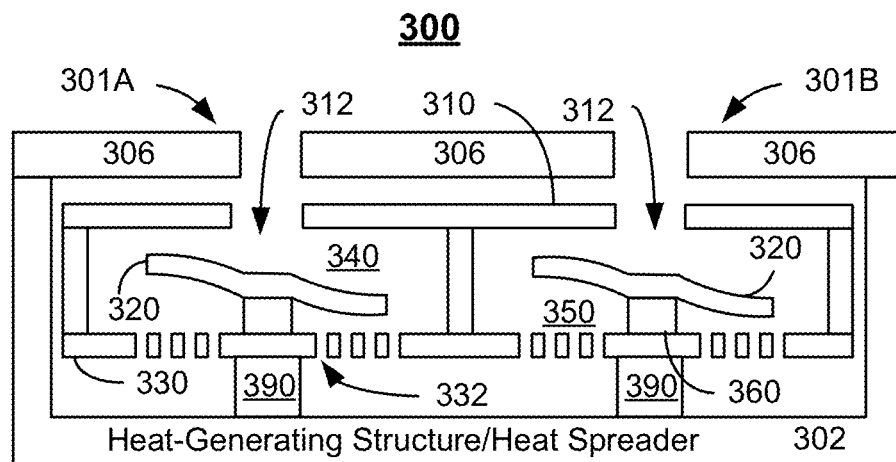
Figure 3E:
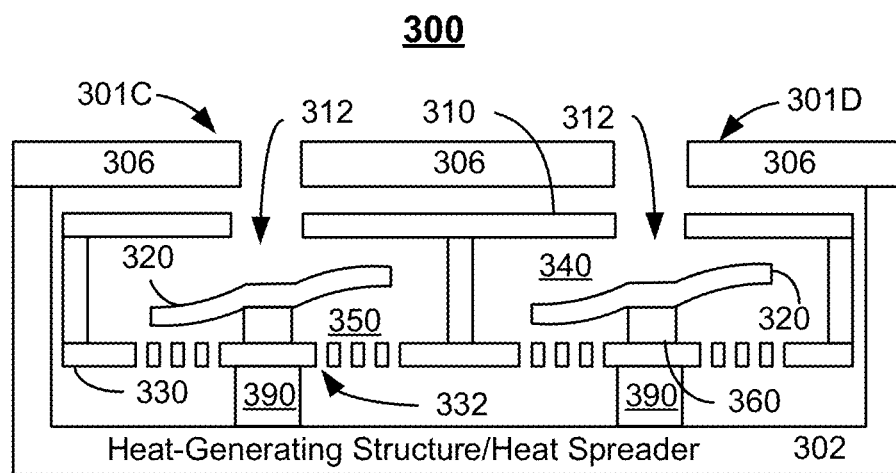

FIGS. 3A-3E depict an embodiment of active MEMS cooling system 300 including multiple cooling cells configured as a module termed a tile, or array. FIG. 3A depicts a perspective view, while FIGS. 3B-3E depict side views. FIGS. 3A-3E are not to scale. Cooling system 300 includes four cooling cells 301A, 301B, 301C and 301D (collectively or generically 301), which are analogous to one or more of cooling systems described herein. More specifically, cooling cells 301 are analogous to cooling system 100 and/or 200. Tile 300 thus includes four cooling cells 301 (i.e. four MEMS jets). Although four cooling cells 301 in a 2×2 configuration are shown, in some embodiments another number and/or another configuration of cooling cells 301 might be employed. In the embodiment shown, cooling cells 301 include shared top plate 310 having apertures 312, cooling elements 320, shared orifice plate 330 including orifices 332, top chambers 340, bottom chambers 350, anchors (support structures) 360, and pedestals 390 that are analogous to top plate 110 having apertures 112, cooling element 120, orifice plate 130 having orifices 132, top chamber 140, bottom chamber 150, anchor 160, and pedestal 190. In some embodiments, cooling cells 301 may be fabricated together and separated, for example by cutting through top plate 310, side walls between cooling cells 301, and orifice plate 330. Thus, although described in the context of a shared top plate 310 and shared orifice plate 330, after fabrication cooling cells 301 may be separated. In some embodiments, tabs (not shown) and/or other structures such as anchors 360, may connect cooling cells 301. Further, tile 300 includes heat-generating structure (termed a heat spreader hereinafter) 302 (e.g. a heat sink, a heat spreader, and/or other structure) that also has sidewalls, or fencing, in the embodiment shown. Cover plate 306 having apertures therein is also shown. Heat spreader 302 and cover plate 306 may be part of an integrated tile 300 as shown or may be separate from tile 300 in other embodiments. Heat spreader 302 and cover plate 306 may direct fluid flow outside of cooling cells 301, provide mechanical stability, and/or provide protection. Electrical connection to cooling cells 301 is provided via flex connector 380 (not shown in FIGS. 3B-5E) which may house drive electronics 385. Cooling elements 320 are driven out-of-phase (i.e. in a manner analogous to a seesaw). Further, as can be seen in FIGS. 3B-3C and FIGS. 3D-3E cooling element 320 in one cell is driven out-of-phase with cooling element(s) 320 in adjacent cell(s). In FIGS. 3B-3C, cooling elements 320 in a row are driven out-of-phase. Thus, cooling element 320 in cell 301A is out-of-phase with cooling element 320 in cell 301B. Similarly, cooling element 320 in cell 301C is out-of-phase with cooling element 320 in cell 301D. In FIGS. 3D-3E, cooling elements 320 in a column are driven out-of-phase. Thus, cooling element 320 in cell 301A is out-of-phase with cooling element 320 in cell 301C. Similarly, cooling element 320 in cell 301B is out-of-phase with cooling element 320 in cell 301D. By driving cooling elements 320 out-of-phase, vibrations in cooling system 300 may be reduced. Cooling elements 320 may be driven in another manner in some embodiments.

Cooling cells 301 of cooling system 300 functions in an analogous manner to cooling system(s) 100, 200, and/or an analogous cooling system. Consequently, the benefits described herein may be shared by cooling system 300. Because cooling elements in nearby cells are driven out-of-phase, vibrations in cooling system 300 may be reduced. Because multiple cooling cells 301 are used, cooling system 300 may enjoy enhanced cooling capabilities. Further, multiples of individual cooling cells 301 and/or cooling system 300 may be combined in various fashions to obtain the desired footprint of cooling cells.

Figure 4:
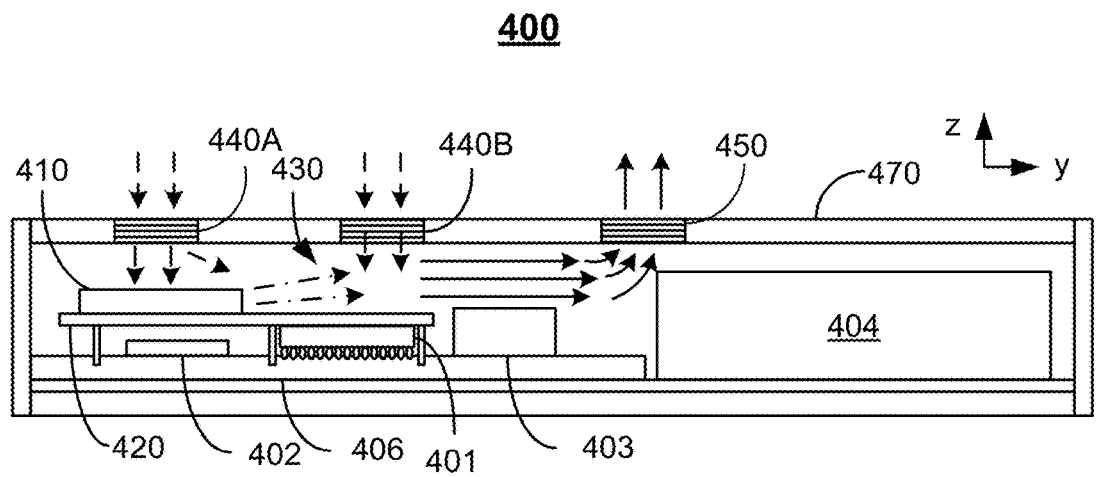
FIG. 4 depicts an embodiment of an active cooling system that utilizes a heat sink and is offset from a heat-generating structure.

FIG. 4 depicts an embodiment of active cooling system 400 that utilizes a heat sink and is offset from a heat-generating structure in a device. FIG. 4 is not to scale and for clarity, only some structures are shown. The device may be a laptop computer, a tablet or notebook computer, a smart phone, and/or other mobile device. The device may also be another device, such as a server in a rack, a game console, or a desktop computer. In some embodiments, therefore, the device is thin. For example, in some embodiments, the device has a thickness (height along the smallest dimension, the z-direction in FIG. 4) of not more than twenty-five millimeters. The thickness is not more than ten millimeters in some embodiments. In some such embodiments, the thickness of the device is not more than eight millimeters. However, other thicknesses are possible.

The device into which cooling system 400 is integrated includes heat-generating structure 401, additional components 402, 403, and 404, substrate 406, and housing 470. Heat-generating structure 401 is a component that is desired to be cooled. For example, heat-generating structure 401 may be an integrated circuit, such as a processor, or other device. During use, heat-generating structure 401 may rise significantly in temperature. For example, for heat-generating structure 401 being a processor, the top near heat spreader 420 may be on the order of ninety degrees Celsius and the junction temperature may be on the order of ninety-three to ninety four degrees Celsius. Substrate 406 may be a printed circuit board (PCB) or other substrate on which heat-generating structure 401 and additional components 402 and 403 are mounted. In some embodiments, substrate 406 may be omitted. Components 402, 403, and 404 may also generate heat.

Also shown are egress passageway 430, inlets 440A and 440B (collectively or generically 440), and egress 450.

Inlets 440A and 440B and egress 450 allow for an exchange in fluid (e.g. air) internal to housing 470 with fluid external to the device. For example, inlets 440A and 440B and egress 450 may be vents. Although two inlets 440A and 440B and one egress 450 are shown, in some embodiments, another number of inlet(s) and/or egress(es) may be present. Although termed inlets, inlet(s) 440A and/or 440B may allow some fluid to exit the device. Similarly, although termed an egress, egress 450 may allow some fluid to enter the device. Thus, the terms inlet and egress are intended to indicate the primary function of the structures 440A, 440B, and 450. In some embodiments, one or more of components 430, 440A, 440B, and/or 450 may be omitted, located differently, and/or configured differently. In some embodiments, egress passageway 430, inlets 440, and egress 450 may be considered part of cooling system 400. Cooling system 400 may be used for thermal management of not only heat-generating structure 401, but also components 402, 403, and/or 404.

Cooling system 400 includes MEMS cooling system 410 and heat spreader 420. MEMS cooling system 410 includes one or more cooling cells analogous to cooling systems 100 and/or 200. In some embodiments, MEMS cooling system 410 includes multiple cooling cells configured as a module termed a tile. For example, MEMS cooling system 410 may include one or more tiles 300, each of which includes multiple cooling cells. MEMS cooling system 410 thus includes cooling element(s) configured to undergo vibrational motion when actuated to drive a fluid. The cooling elements are considered to be fluidically connected with heat spreader 420. MEMS cooling system 410 may also include top plate(s), anchor(s), orifice plate(s), and/or pedestal(s) analogous to those described in the context of cooling system 100 and/or 200. MEMS cooling system 410 may also include an integrated heat spreader, fencing, and cover analogous to those described in the context of tile 300. MEMS cooling system 410 may have a thickness of not more than three millimeters. In some embodiments, MEMS cooling system 410 has a thickness of not more than 2.5 millimeters. MEMS cooling system 410 may have a thickness of not more than two millimeters.

MEMS cooling system 410 is thermally coupled with heat spreader 420. In some embodiments, MEMS cooling system 410 is physically connected to heat spreader 420. For example, the integrated heat spreader of MEMS cooling system 410 may be affixed to heat spreader 420 through a thermally conductive epoxy or analogous material. In some embodiments, MEMS cooling system 410 is fluidically coupled with heat spreader 420. Stated differently, fluid driven by cooling elements in MEMS cooling system 410 may remove heat from MEMS cooling system 410 and/or heat spreader 420. MEMS cooling system 410 is offset from heat-generating structure 401. Although both MEMS cooling system 410 and heat-generating structure 401 are thermally coupled with heat spreader 410, MEMS cooling system 410 is not aligned with heat-generating structure 401. In the absence of heat spreader 420, MEMS cooling system 410 would not drive fluid directly on or directly toward heat-generating structure 401. Stated differently, the cooling element(s) of MEMS cooling system 410 undergo vibrational motion when actuated to drive a fluid toward heat spreader 420 while not directing the fluid directly at heat-generating structure 401. This is in contrast to the location of component 402 with respect to MEMS cooling system 410.

Although termed a heat spreader, structure 420 may be a heat spreader, vapor chamber (or heat pipe), heat sink, and/or other component that is thermally coupled to heat-generating structure 401 and transfers heat from heat-generating structure 401. Although shown as being in physical contact with heat-generating structure 401, in some embodiments, heat spreader 420 may be thermally connected to heat-generating structure 401 via a thermal interface material and/or other conductor of heat. In some embodiments, heat spreader 420 is thermally connected to heat-generating structure 401 in another manner. Thus, heat produced by heat-generating structure 401 is readily transferred to heat spreader 420.

In the embodiment shown, fluid (e.g. air) enters the device via inlet 440A and is driven via MEMS cooling system 410. The fluid entering via inlet 440A is cooler. The cool fluid may be the temperature of the ambient in which the device operates. For example, the cool fluid may be at or near room temperature (e.g. 22-28 degrees Celsius). This flow of cooler fluid is shown by dashed arrows. Some, most, or all of this fluid flows through MEMS cooling system 410. Fluid enters MEMS cooling system 410 via apertures (not shown in FIG. 4), is driven through MEMS cooling system 410 by vibrational motion of cooling elements (not shown in FIG. 4), and exits MEMS cooling system 410. Heat from heat-generating structure 401 is transferred to heat spreader 420 (e.g. via conduction) and from heat spreader 420 to the fluid driven through MEMS cooling system 410. The heat may be directly transferred to the fluid (e.g. if the fluid impinges on heat spreader 420). The heat may be indirectly transferred to the fluid, for example via an integrated heat spreader for MEMS cooling system 410 that is thermally connected to heat spreader 420 and on which the fluid impinges. In traversing MEMS cooling system 410, the fluid is heated. Thus, hot fluid exits MEMS cooling system 410. The flow of heated fluid is shown by the dotted/dashed arrows in FIG. 4. In some embodiments, the heated fluid exiting MEMS cooling system 410 has a temperature of at least sixty degrees Celsius. In some embodiments, the heated fluid exiting MEMS cooling system 410 is at least sixty-five degrees Celsius. In some embodiments, the heated fluid exiting MEMS cooling system 410 is at least seventy degrees Celsius. The fluid may exit primarily via egress 450. In some embodiments, the heated fluid may exit the device in another manner. For example, inlet 440B may be used as an egress. Although heated fluid may travel in egress channel 430 in the vicinity of heat spreader 420, heat has been efficiently removed from heat spreader 420 (and thus heat-generating structure 401) via MEMS cooling system 410. Stated differently, MEMS cooling system 410 and thus cooling system 400 may efficiently cool heat-generating structure 401 despite not being aligned with heat-generating structure 401.

In some embodiments, cooling system 400 may also employ entrainment. However, nothing prevents the use of cooling system 400 without significant use of entrainment for managing heat. In the embodiment shown, the heated fluid driven by MEMS cooling system 410 travels at high speeds. For example, fluid leaving the orifice plate may travel at the speeds described herein (e.g. greater than thirty-five meters per second). The flow of heated fluid outside of MEMS cooling system 410 is also at a high speed. Consequently, a region of low pressure may be developed within egress passageway 430. The low pressure and/or high fluid flow of egress passageway 430 due to MEMS cooling system 410 entrains fluid into inlet 440B. Stated differently, fluid is drawn into egress passageway 430 from inlet 440B. In some embodiments, some portion of the fluid entering via inlet 440A may also be entrained and move into egress passageway 430. In the embodiment shown, the entrained fluid is from the ambient and thus may have a temperature similar to the fluid drawn into inlet 440A. The flow of cooler fluid into inlet 440B is indicated by dashed arrows in FIG. 4. The flow of cool fluid through inlet 440B is at least one-half multiplied by the fluid flow from MEMS cooling system 410. In some embodiments, the flow of cool fluid through inlet 440B is at least as large as the fluid flow from MEMS cooling system 410. The flow of cool fluid from inlet 440B in egress passageway 430 may be greater than the flow of fluid through MEMS cooling system 410. In some embodiments, the flow of cool fluid from inlet 440B in egress passageway 430 is at least 1.5 multiplied by the flow of fluid through MEMS cooling system 410. In some embodiments, the flow of cool fluid from inlet 440B in egress passageway 430 is at least two multiplied by the flow of fluid through MEMS cooling system 410.

Egress passageway 430 receives hot fluid from MEMS cooling system 410 and the cool fluid from inlet 440B. The hot fluid from MEMS cooling system 410 mixes with the cooler fluid from inlet 440B in egress passageway 430. Thus, the hot fluid from MEMS cooling system 410 is cooled. The flow of the mixture of the heated fluid from MEMS cooling system 410 and cool fluid from inlet 440B is shown by solid arrows in FIG. 4. The mixture of heated and cool fluid exits egress passageway via egress 450. Because cool fluid is mixed with hot fluid in egress passageway 430, the mixture of fluid exiting via egress 450 may have a significantly lower temperature than the hot fluid leaving MEMS cooling system 410. For example, the mixture of the hot air and the cool air at egress 450 may have a temperature not exceeding sixty degrees Celsius for the heat-generating structure being at least seventy degrees Celsius (e.g. for the heat-generating component having a temperature of at least ninety degrees Celsius). In some embodiments, the temperature of the fluid mixture at egress 450 does not exceed fifty-five degrees Celsius. For example, the mixture of fluid may have a temperature of at least fifty and not more than fifty-five degrees Celsius. In some embodiments, the temperature at egress 450 may be lower. For example, the fluid mixture exiting the device via egress 450 may be forty through forty-five degrees Celsius.

In addition to cooling the hot fluid from MEMS cooling system 410, the cool air entrained through inlet(s) 440A and/or 440B may also be used to cool other components. For example, the entrained air may be used to cool heat spreader 420. The entrained air may also be used to cool component(s) 403 and/or 404.

Cooling system 400 may improve thermal management of the device(s) in which cooling system 400 is incorporated. MEMS cooling system 410 may provide efficient cooling in a low-profile package. For example, in some embodiments, MEMS cooling system 410 may provide up to ten Watts of power dissipation while consuming three Watts of power. Further, MEMS cooling system 410 is thin (e.g. MEMS cooling system 410 is not more than three millimeters thick). Thus, cooling system 400 may be used in confined spaces and thin devices. For example, MEMS cooling system 410 may be placed above component 402 that has a lower profile than heat-generating structure 401. Cooling system 400, its location in the device, and the device itself may be configured to allow the device to remain thin. Because heat-generating structure 401 and/or other components may be better cooled, performance may be improved. Further, entrainment provided via egress passageway 430 may provide higher flow and greater cooling. In addition, fluid used in cooling the device exits the device at a lower temperature. For example, fluid exiting egress 450 may be fifty through fifty-five degrees Celsius in some cases. Thus, the fluid is less likely to cause discomfort to or burn a user. Thus, performance of devices incorporating cooling system 400 may be improved.

Figure 5:
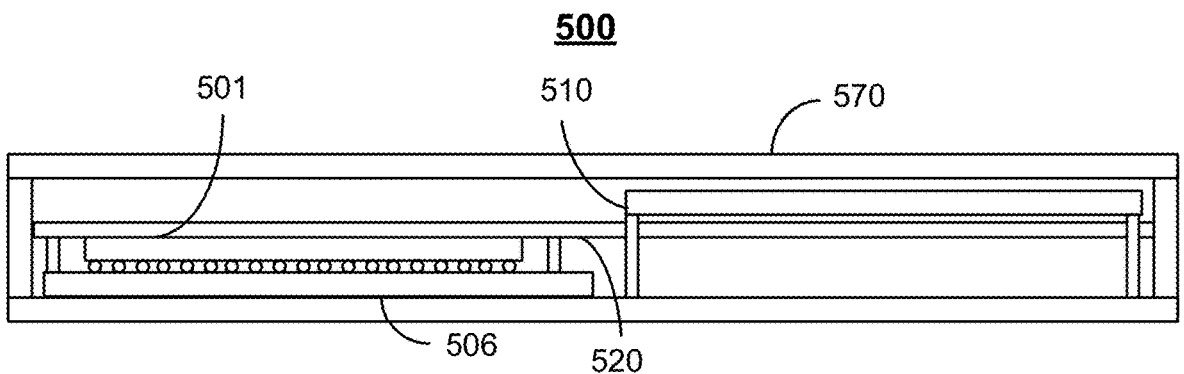
FIG. 5 depicts an embodiment of an active cooling system that utilizes a heat sink and is offset from a heat-generating structure.

FIG. 5 depicts an embodiment of active cooling system 500 that utilizes a heat sink and is offset from a heat-generating structure. FIG. 5 is not to scale and for clarity, only some structures are shown. The device with which system 500 is used may be a laptop computer, a tablet or notebook computer, a smart phone, and/or other mobile device. The device may also be another device, such as a server in a rack, a game console, or a desktop computer. In some embodiments, therefore, the device is thin. For example, in some embodiments, the device has a thickness (height along the smallest dimension, the z-direction in FIG. 5) of not more than twenty-five millimeters. The thickness is not more than ten millimeters in some embodiments. In some such embodiments, the thickness of the device is not more than eight millimeters. However, other thicknesses are possible.

The device into which cooling system 500 is integrated includes heat-generating structure 501, substrate 506, and housing 570. Heat-generating structure 501, substrate 506 and housing 570 are analogous to heat-generating structure 401, substrate 406, and housing 470, respectively. Thus, heat-generating structure 501 is a component that is desired to be cooled and which may rise significantly in temperature during use. For example, for heat-generating structure 501 may have temperatures in the ranges described with respect to heat-generating structure 401. Other components (not shown) may also generate heat.

Cooling system 500 is analogous to cooling system 400 and functions in an analogous manner. Thus, cooling system 500 includes MEMS cooling system 510 and heat spreader 520 that are analogous to MEMS cooling system 410 and heat spreader 420. MEMS cooling system 510 includes one or more cooling cells analogous to cooling systems 100 and/or 200. In some embodiments, MEMS cooling system 510 includes multiple cooling cells configured as a module termed a tile. For example, MEMS cooling system 510 may include one or more tiles 300, each of which includes multiple cooling cells. MEMS cooling system 510 thus includes cooling element(s) configured to undergo vibrational motion when actuated to drive a fluid. The cooling elements are considered to be fluidically connected with heat spreader 520. MEMS cooling system 510 may also include top plate(s), anchor(s), orifice plate(s), and/or pedestal(s) analogous to those described in the context of cooling system 100 and/or 200. MEMS cooling system 510 may also include an integrated heat spreader, fencing, and cover analogous to those described in the context of tile 300. MEMS cooling system 510 may have a thickness of not more than three millimeters. In some embodiments, MEMS cooling system 510 has a thickness of not more than 2.5 millimeters. MEMS cooling system 510 may have a thickness of not more than two millimeters.

MEMS cooling system 510 is thermally coupled with heat spreader 520. In the embodiment shown, MEMS cooling system 510 is thermally coupled to heat spreader 520 via fluid driven by MEMS cooling system 510. In some embodiments, MEMS cooling system 510 is physically connected to heat spreader 520, for example via a thermally conductive epoxy or analogous material. Fluid driven by cooling elements in MEMS cooling system 510 may remove heat from MEMS cooling system 510 and/or heat spreader 520. As such, MEMS cooling system 510 and the cooling elements therein may be considered to be fluidically and thermally connected to heat spreader 520. MEMS cooling system 510 is offset from heat-generating structure 501. Although both MEMS cooling system 510 and heat-generating structure 501 are thermally coupled with heat spreader 510, MEMS cooling system 510 is not aligned with heat-generating structure 501. Stated differently, the cooling element(s) of MEMS cooling system 510 undergo vibrational motion when actuated to drive a fluid toward heat spreader 520 while not directing the fluid directly at heat-generating structure 501.

Heat spreader 520 may be a heat spreader, vapor chamber (or heat pipe), heat sink, and/or other component that is thermally coupled to heat-generating structure 501 and transfers heat from heat-generating structure 501. Although shown as being in physical contact with heat-generating structure 501, in some embodiments, heat spreader 520 may be thermally connected to heat-generating structure 501 via a thermal interface material and/or other conductor of heat. In some embodiments, heat spreader 520 is thermally connected to heat-generating structure 501 in another manner. Thus, heat produced by heat-generating structure 501 is readily transferred to heat spreader 520.

In the embodiment shown, fluid (e.g. air) enters MEMS cooling system 510 via aperture(s) (not shown). The fluid entering via inlet 540A is cooler. The cool fluid may be the temperature of the ambient in which the device operates, particularly if the device includes inlets or vent (not shown in FIG. 5). If the device in which cooling system 500 is used is closed, the cool fluid may have a temperature that is higher than the ambient. The cooler fluid is driven through MEMS cooling system 510 by vibrational motion of cooling elements (not shown in FIG. 5), and exits MEMS cooling system 510. Heat from heat-generating structure 501 is transferred to heat spreader 520 (e.g. via conduction) and from heat spreader 520 to the fluid driven through MEMS cooling system 510. The heat may be directly transferred to the fluid (e.g. if the fluid impinges on heat spreader 520). The heat may be indirectly transferred to the fluid, for example via an integrated heat spreader for MEMS cooling system 510 that is thermally connected to heat spreader 520 and on which the fluid impinges. The fluid may be circulated through the device to be cooled or may exit the device via an egress or vent (not shown in FIG. 5). Although heated fluid may travel in an egress channel (not explicitly indicated in FIG. 5) in the vicinity of heat spreader 520, heat has been efficiently removed from heat spreader 520 (and thus heat-generating structure 501) via MEMS cooling system 510. Stated differently, MEMS cooling system 510 and thus cooling system 500 may efficiently cool heat-generating structure 501 despite not being aligned with heat-generating structure 501. In some embodiments, cooling system 500 may also employ entrainment. However, nothing prevents the use of cooling system 500 without significant use of entrainment for managing heat.

Cooling system 500 may share some or all the benefits of cooling system 400. MEMS cooling system 510 may provide efficient cooling in a low-profile package. MEMS cooling system 510 is thin (e.g. MEMS cooling system 510 is not more than three millimeters thick). Thus, cooling system 500 may be used in confined spaces and thin devices. Cooling system 500, its location in the device, and the device itself may be configured to allow the device to remain thin. Because heat-generating structure 501 and/or other components may be better cooled, performance may be improved. Further, entrainment may be incorporated to provide a higher flow, greater cooling, and cooler exhaust. Thus, performance of devices incorporating cooling system 500 may be improved.

Figure 6A:
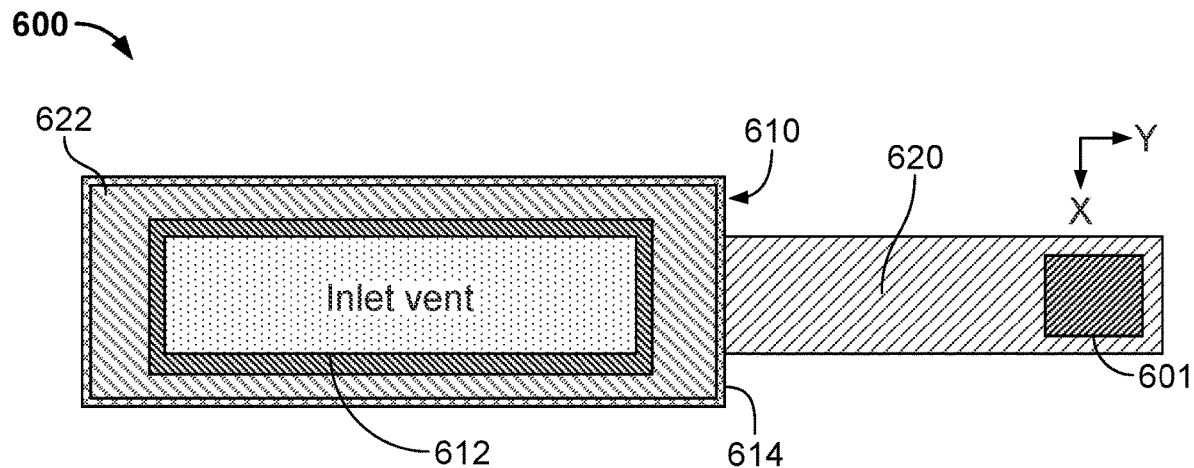
FIGS. 6A-6B depict an embodiment of an active cooling system that utilizes a heat sink and is offset from a heat-generating structure.
Figure 6B:
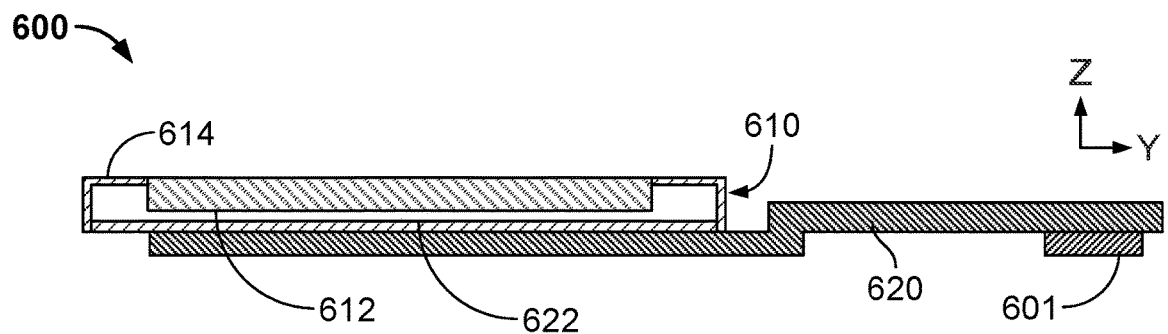

FIGS. 6A-6B depict an embodiment of active cooling system 600 that utilizes a heat sink and is offset from a heat-generating structure. FIG. 6A depicts a plan view of cooling system 600, while FIG. 6B depicts a cross-sectional view of cooling system 600. FIGS. 6A-6B are not to scale and for clarity, only some structures are shown. The device with which cooling system 600 is used may be a laptop computer, a tablet or notebook computer, a smart phone, and/or other mobile device. The device may also be another device, such as a server in a rack, a game console, or a desktop computer. In some embodiments, therefore, the device is thin. For example, in some embodiments, the device has a thickness (height along the smallest dimension, the z-direction in FIG. 6) of not more than twenty-five millimeters. The thickness is not more than ten millimeters in some embodiments. In some such embodiments, the thickness of the device is not more than eight millimeters. However, other thicknesses are possible.

The device into which cooling system 600 is integrated includes heat-generating structure 601 that is analogous to heat-generating structure(s) 401 and/or 501. For simplicity, other structures are not shown. Further, heat-generating structure 601 is indicated as being mounted to heat spreader 620. Thus, heat-generating structure 601 is a component that is desired to be cooled and which may rise significantly in temperature during use. For example, for heat-generating structure 601 may have temperatures in the ranges described with respect to heat-generating structure(s) 401 and/or 501. Other components (not shown) may also generate heat.

Cooling system 600 is analogous to cooling system(s) 400 and/or 500 and functions in an analogous manner. Thus, cooling system 600 includes MEMS cooling system 610 and heat spreader 620 that are analogous to MEMS cooling system(s) 410 and/or 510 and heat spreader 420 and/or 520. MEMS cooling system 610 includes one or more cooling cells (generically indicated by 612) analogous to cooling systems 100 and/or 200. In some embodiments, MEMS cooling system 610 is configured as a module termed a tile. For example, MEMS cooling system 610 may include one or more tiles 300, each of which includes multiple cooling cells. Cooling cells 612 include cooling element(s) (not shown) configured to undergo vibrational motion when actuated to drive a fluid. The cooling elements are considered to be fluidically connected with heat spreader 620. Cooling cells 612 may also include top plate(s), anchor(s), orifice plate(s), and/or pedestal(s) analogous to those described in the context of cooling system 100 and/or 200. MEMS cooling system 610 thus includes integrated surrounding structure 614 (which includes a cover and fencing) and integrated heat spreader 622 analogous to those described in the context of tile 300. MEMS cooling system 610 may have a thickness of not more than three millimeters. In some embodiments, MEMS cooling system 610 has a thickness of not more than 2.5 millimeters. MEMS cooling system 610 may have a thickness of not more than two millimeters.

MEMS cooling system 610 is thermally coupled with heat spreader 620. In the embodiment shown, MEMS cooling system 610 is thermally coupled to heat spreader 620 via fluid driven by MEMS cooling system 610. In some embodiments, MEMS cooling system 610 is physically connected to heat spreader 620, for example via a thermally conductive epoxy or analogous material. More specifically, integrated heat spreader 622 is coupled with heat spreader 620. Fluid driven by cooling elements in cooling system cells 612 remove heat from integrated heat spreader 622 and thus from heat spreader 620 and MEMS cooling system 610. As such, MEMS cooling system 610 and the cooling elements therein may be considered to be fluidically and thermally connected to heat spreader 620. MEMS cooling system 610 is offset from heat-generating structure 601. Although both MEMS cooling system 610 and heat-generating structure 601 are thermally coupled with heat spreader 610, MEMS cooling system 610 is not aligned with heat-generating structure 601. Stated differently, the cooling element(s) of MEMS cooling system 610 undergo vibrational motion when actuated to drive a fluid toward heat spreader 620 while not directing the fluid directly at heat-generating structure 601.

Heat spreader 620 may be a heat spreader, vapor chamber (or heat pipe), heat sink, and/or other component that is thermally coupled to heat-generating structure 601 and transfers heat from heat-generating structure 601. Although shown as being in physical contact with heat-generating structure 601, in some embodiments, heat spreader 620 may be thermally connected to heat-generating structure 601 via a thermal interface material and/or other conductor of heat. In some embodiments, heat spreader 620 is thermally connected to heat-generating structure 601 in another manner. Thus, heat produced by heat-generating structure 601 is readily transferred to heat spreader 620. Further, heat spreader 620 includes an offset in the z-direction (a "vertical" offset). Thus, MEMS cooling system 610 may be considered to be recessed from the top of the portion of heat spreader 620 coupled to heat-generating structure 601.

MEMS cooling system 610 functions in an analogous manner to MEMS cooling systems 410 and 510. Cooler fluid enters cooling cells 612, for example via inlet apertures or vents. The cool fluid may be the temperature of the ambient in which the device operates. If the device in which cooling system 600 is used is closed, the cool fluid may have a temperature that is higher than the ambient. The cooler fluid is driven through MEMS cooling system 610 by vibrational motion of cooling elements (not shown in FIG. 6), and exits MEMS cooling system 610. Heat from heat-generating structure 601 is transferred to heat spreader 620 (e.g. via conduction), from head spreader 620 to heat spreader 622, and from heat spreader 622 to the fluid driven through MEMS cooling system 610. The fluid may be circulated through the device to be cooled or may exit the device via an egress or vent (not shown in FIG. 6). Although heated fluid may travel in an egress channel (not explicitly indicated in FIG. 6) in the vicinity of heat spreader 620, heat has been efficiently removed from heat spreader 620 (and thus heat-generating structure 601) via MEMS cooling system 610. Stated differently, MEMS cooling system 610 and thus cooling system 600 may efficiently cool heat-generating structure 601 despite not being aligned with heat-generating structure 601. In some embodiments, cooling system 600 may also employ entrainment. However, nothing prevents the use of cooling system 600 without significant use of entrainment for managing heat.

Cooling system 600 may share some or all the benefits of cooling system(s) 400 and/or 500. MEMS cooling system 610 may provide efficient cooling in a low-profile package. MEMS cooling system 610 is thin (e.g. MEMS cooling system 610 is not more than three millimeters thick). Thus, cooling system 600 may be used in confined spaces and thin devices. Further, heat spreader 620 has a vertical offset. This vertical offset may further reduce the profile of cooling system 600. Thus, cooling system 600, its location in the device, and the device itself may be configured to allow the device to remain thin. Because heat-generating structure 601 and/or other components may be better cooled, performance may be improved. Further, entrainment may be incorporated to provide a higher flow, greater cooling, and cooler exhaust. Thus, performance of devices incorporating cooling system 600 may be improved.

Figure 7A:
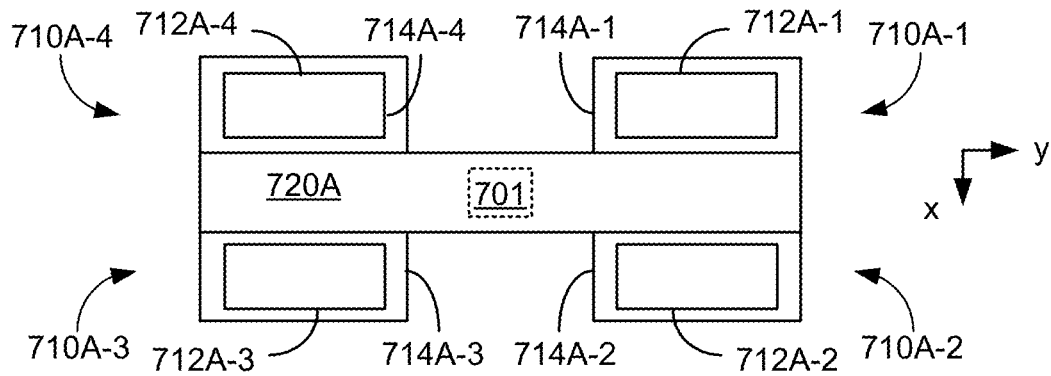
FIGS. 7A-7C depict embodiments of active cooling systems that utilize heat sinks and are offset from a heat-generating structure.
Figure 7B:
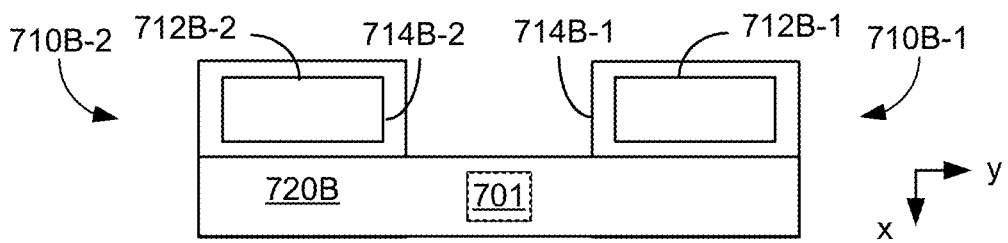
Figure 7C:
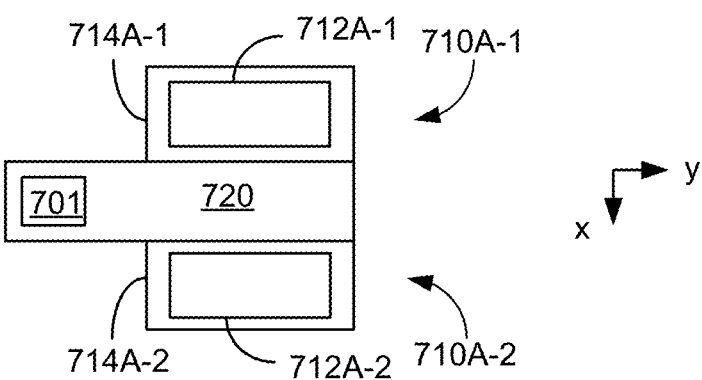

FIGS. 7A-7C depict plan views of embodiments of active cooling systems 700A, 700B, and 700C that utilize heat sinks and are offset from a heat-generating structure. FIGS. 7A-7C are not to scale and for clarity, only some structures are shown. The device(s) with which cooling system(s) 700A, 700B, and/or 700C are used may be laptop computers, tablet or notebook computers, smart phones, and/or other mobile devices. The device(s) may also be other device(s), such as servers in rack(s), game console(s), or desktop computer(s). In some embodiments, therefore, the device is thin. For example, in some embodiments, the device has a thickness (height along the smallest dimension) of not more than twenty-five millimeters. The thickness is not more than ten millimeters in some embodiments. In some such embodiments, the thickness of the device is not more than eight millimeters. However, other thicknesses are possible.

The device(s) into which cooling system(s) 700A, 700B, and/or 700C are integrated include heat-generating structure 701 that is analogous to heat-generating structure(s) 401 and/or 501. For simplicity, other structures are not shown. Thus, heat-generating structure 701 is a component that is desired to be cooled and which may rise significantly in temperature during use. For example, for heat-generating structure 701 may have temperatures in the ranges described with respect to heat-generating structure(s) 401, 501 and/or 601. Other components (not shown) may also generate heat.

Cooling systems 700A, 700B, and 700C are analogous to cooling system(s) 400, 500, and/or 600 and functions in an analogous manner Cooling system 700A includes four MEMS cooling systems 710A-1, 710A-2, 710A-3, and 710A-4 (collectively or generically 710A) which include cooling cells 712A-1, 712A-2, 712A-3, and 712A-4 (collectively or generically 712A) and surrounding structures 714A-1, 714A-2, 714A-3, and 714A-4 (collectively or generically 714A) that are analogous to MEMS cooling system 610, cooling cells 612, and structure 614, respectively. Cooling system 700A also includes heat sink 720A that is analogous to heat sink(s) 420, 520, and/or 620. Although both MEMS cooling systems 710A and heat-generating structure 701 are thermally coupled with heat spreader 710A, MEMS cooling systems 710A are not aligned with heat-generating structure 701. More specifically, in addition to being offset in the y-direction, MEMS cooling systems 710A are offset from heat-generating structure 701 in the x-direction. Thus, the cooling element(s) of MEMS cooling system 710A undergo vibrational motion when actuated to drive a fluid toward heat spreader 720A while not directing the fluid directly at heat-generating structure 701. Further, although not indicated in FIG. 7A, heat spreader 720A may have a vertical offset.

Cooling system 700B includes two MEMS cooling systems 710B-1 and 710B-2 (collectively or generically 710B) which include cooling cells 712B-1 and 712B-2 (collectively or generically 712B) and surrounding structures 714B-1 and 714B-2 (collectively or generically 714B) that are analogous to MEMS cooling system 610, cooling cells 612, and structure 614, respectively. Cooling system 700A also includes heat pipe/spreader 720B that is analogous to heat spreader(s) 420, 520, and/or 620. Although both MEMS cooling systems 710B and heat-generating structure 701 are thermally coupled with heat spreader 710B, MEMS cooling systems 710B are not aligned with heat-generating structure 701. In addition to being offset in the y-direction, MEMS cooling systems 710B are offset from heat-generating structure 701 in the x-direction. Thus, the cooling element(s) of MEMS cooling system 710B undergo vibrational motion when actuated to drive a fluid toward heat spreader 720B while not directing the fluid directly at heat-generating structure 701. Further, although not indicated in FIG. 7B, heat spreader 720B may have a vertical offset.

Cooling system 700C also includes two MEMS cooling systems 710C-1 and 710C-2 (collectively or generically 710C) which include cooling cells 712C-1 and 712C-2 (collectively or generically 712C) and surrounding structures 714C-1 and 714C-2 (collectively or generically 714C) that are analogous to MEMS cooling system 610, cooling cells 612, and structure 614, respectively. Cooling system 700C also includes heat pipe/spreader 720C that is analogous to heat spreader(s) 420, 520, and/or 620. Although both MEMS cooling systems 710C and heat-generating structure 701 are thermally coupled with heat spreader 710C, MEMS cooling systems 710B are not aligned with heat-generating structure 701. In addition to being offset in the y-direction, MEMS cooling systems 710C are offset from heat-generating structure 701 in the x-direction. Thus, the cooling element(s) of MEMS cooling system 710C undergo vibrational motion when actuated to drive a fluid toward heat spreader 720C while not directing the fluid directly at heat-generating structure 701. Further, although not indicated in FIG. 7C, heat spreader 720C may have a vertical offset.

Cooling systems 700A, 700B, and 700C may share some or all the benefits of cooling system(s) 400, 500, and/or 600. MEMS cooling systems 710A, 710B, and 710C may provide efficient cooling in a low-profile package. MEMS cooling systems 710A, 710B, and 710C are thin (e.g. MEMS cooling systems 710A, 710B, and 710C are each not more than three millimeters thick). Thus, cooling systems 700A, 700B, and 700C may be used in confined spaces and thin devices. The profile of cooling systems 700A, 700B, and 700C may be further reduced if heat sinks 720A, 720B, and 720C have a vertical offset. Thus, cooling systems 700A, 700B, and 700C, their locations in the device(s), and the device(s) themselves may be configured to allow the devices to remain thin. Because heat-generating structure 701 and/or other components may be better cooled, performance may be improved. Further, entrainment may be incorporated to provide a higher flow, greater cooling, and cooler exhaust. Thus, performance of devices incorporating cooling systems 700A, 700B, and 700C may be improved.

Figure 8A:
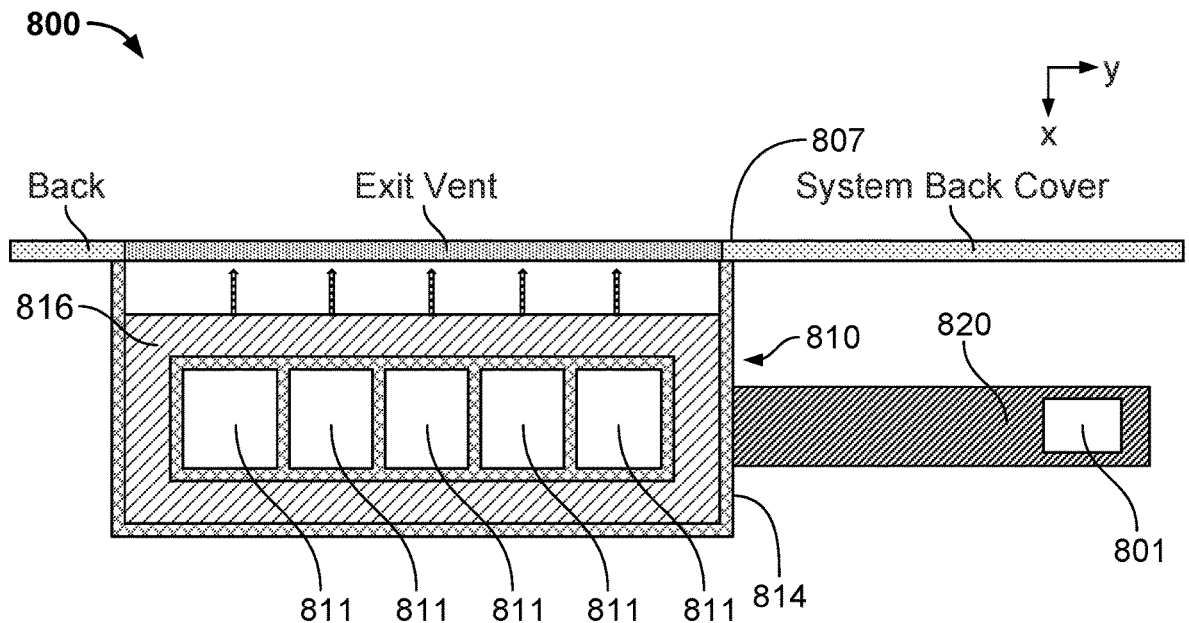
FIGS. 8A-8B depict an embodiment of an active cooling system that utilizes a heat sink and is offset from a heat-generating structure.
Figure 8B:
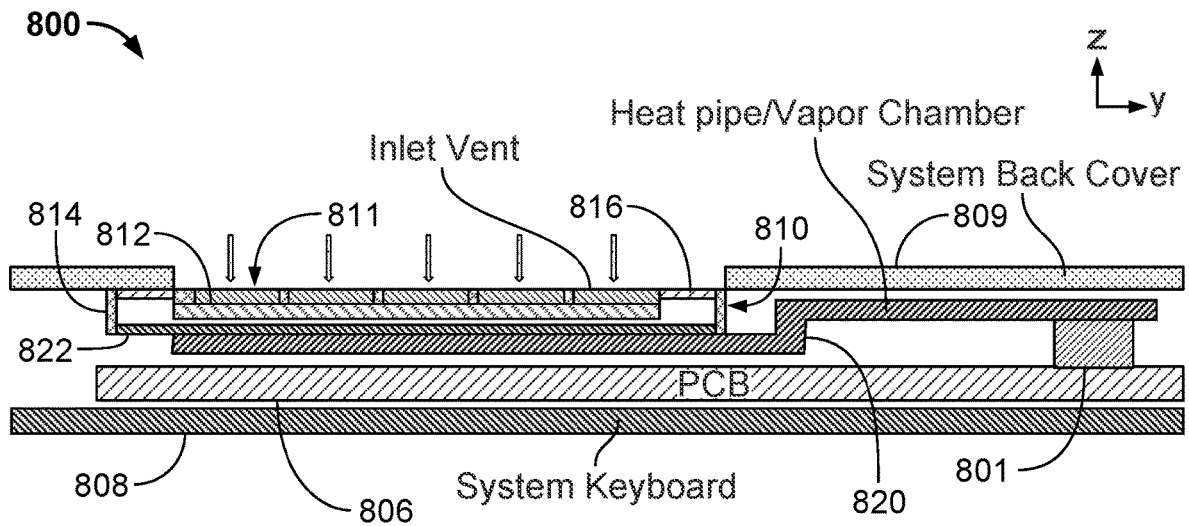

FIGS. 8A-8B depict an embodiment of active cooling system 800 that utilizes a heat sink and is offset from a heat-generating structure. FIG. 8A depicts a plan view of cooling system 800, while FIG. 8B depicts a cross-sectional view of cooling system 800. FIGS. 8A-8B are not to scale and for clarity, only some structures are shown. The device with which cooling system 800 is used may be a laptop computer, a tablet or notebook computer, a smart phone, a server in a rack, a game console, a desktop computer, and/or another device. In some embodiments, therefore, the device is thin. For example, in some embodiments, the device has a thickness (height along the smallest dimension, the z-direction in FIG. 8) analogous to those discussed herein.

The device into which cooling system 800 is integrated includes heat-generating structure 801 that is analogous to heat-generating structure(s) 401, 501, 601 and/or 701. Also shown are substrate 806 (e.g. a PCB), system back cover 807 (e.g. which may be at the rear of the device facing away from the user), back cover 809 (e.g. which may be proximate to a table or other structure supporting the device), and system front/keyboard 808. In other embodiments, other and/or additional components may be included. Further, heat-generating structure 801 is mounted and/or thermally coupled to heat spreader 820. Thus, heat-generating structure 801 is a component that is desired to be cooled and which may rise significantly in temperature during use. For example, for heat-generating structure 801 may have temperatures in the ranges described with respect to heat-generating structure(s) 401 and/or 501. Other components (not shown) may also generate heat.

Cooling system 800 is analogous to cooling system(s) 400, 500, and/or 600 and functions in an analogous manner. Thus, cooling system 800 includes MEMS cooling system 810 and heat spreader 820 that are analogous to MEMS cooling system(s) 410, 510 and/or 610 and heat spreader 420, 520, and/or 620. MEMS cooling system 810 includes one or more cooling cells (generically indicated by 812) analogous to cooling systems 100 and/or 200. Also indicated are vents 811 through which fluid may flow to cooling cells 812. In some embodiments, MEMS cooling system 810 may include one or more tiles 300, each of which includes multiple cooling cells. Cooling cells 812 include cooling element(s) (not shown) configured to undergo vibrational motion when actuated to drive a fluid. The cooling elements are considered to be fluidically connected with heat spreader 820. Cooling cells 812 may also include top plate(s), anchor(s), orifice plate(s), and/or pedestal(s) analogous to those described in the context of cooling system 100 and/or 200. MEMS cooling system 810 thus includes integrated surrounding structure 814 (which includes cover 816 and fencing) and integrated heat spreader 822 analogous to those described in the context of tile 300. MEMS cooling system 810 may have a thickness of not more than three millimeters. In some embodiments, MEMS cooling system 810 has a thickness of not more than 2.5 millimeters. MEMS cooling system 810 may have a thickness of not more than two millimeters.

MEMS cooling system 810 is thermally coupled with heat spreader 820. In some embodiments, MEMS cooling system 810 is physically connected to heat spreader 820, for example via a thermally conductive epoxy or analogous material. More specifically, integrated heat spreader 822 is coupled with heat spreader 820. Fluid driven by cooling elements in cooling system cells 812 remove heat from integrated heat spreader 822 and thus from heat spreader 820 and MEMS cooling system 810. As such, MEMS cooling system 810 and the cooling elements therein may be considered to be fluidically and thermally connected to heat spreader 820. MEMS cooling system 810 is offset from heat-generating structure 801 in the y-direction. In some embodiments, MEMS cooling system 810 may be offset in the x direction instead of or in addition to the offset in the y-direction. Thus, the cooling element(s) of MEMS cooling system 810 undergo vibrational motion when actuated to drive a fluid toward heat spreader 820 while not directing the fluid directly at heat-generating structure 801.

Heat spreader 820 may be a heat spreader, vapor chamber (or heat pipe), heat sink, and/or other component that is thermally coupled to heat-generating structure 801 and transfers heat from heat-generating structure 801. Although shown as being in physical contact with heat-generating structure 801, in some embodiments, heat spreader 820 may be thermally connected to heat-generating structure 801 via a thermal interface material and/or other conductor of heat. In some embodiments, heat spreader 820 is thermally connected to heat-generating structure 801in another manner. Thus, heat produced by heat-generating structure 801 is readily transferred to heat spreader 820. Further, heat spreader 820 includes a vertical offset (in the z-direction). Thus, MEMS cooling system 810 may be considered to be recessed from the top of the portion of heat spreader 820 coupled to heat-generating structure 801.

Cooling system 800 may share some or all the benefits of cooling system(s) 400, 500, 600, 700A, 700B, and/or 700C. MEMS cooling system 810 may provide efficient cooling in a low-profile package. MEMS cooling system 810 is thin (e.g. MEMS cooling system 810 is not more than three millimeters thick). Thus, cooling system 800 may be used in confined spaces and thin devices. Further, heat spreader 820 has a vertical offset. This vertical offset may further reduce the profile of cooling system 800. Thus, cooling system 800, its location in the device, and the device itself may be configured to allow the device to remain thin. Because heat-generating structure 801 and/or other components may be better cooled, performance may be improved. Further, entrainment may be incorporated to provide a higher flow, greater cooling, and cooler exhaust. Thus, performance of devices incorporating cooling system 800 may be improved.

Figure 9A:
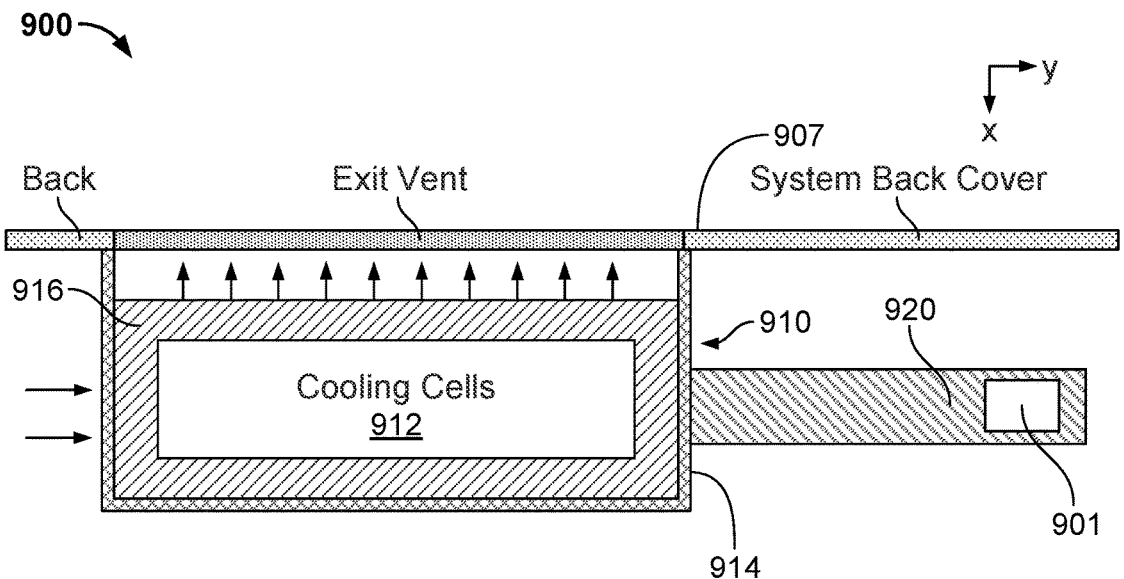
FIGS. 9A-9B depict an embodiment of an active cooling system that utilizes a heat sink and is offset from a heat-generating structure.
Figure 9B:
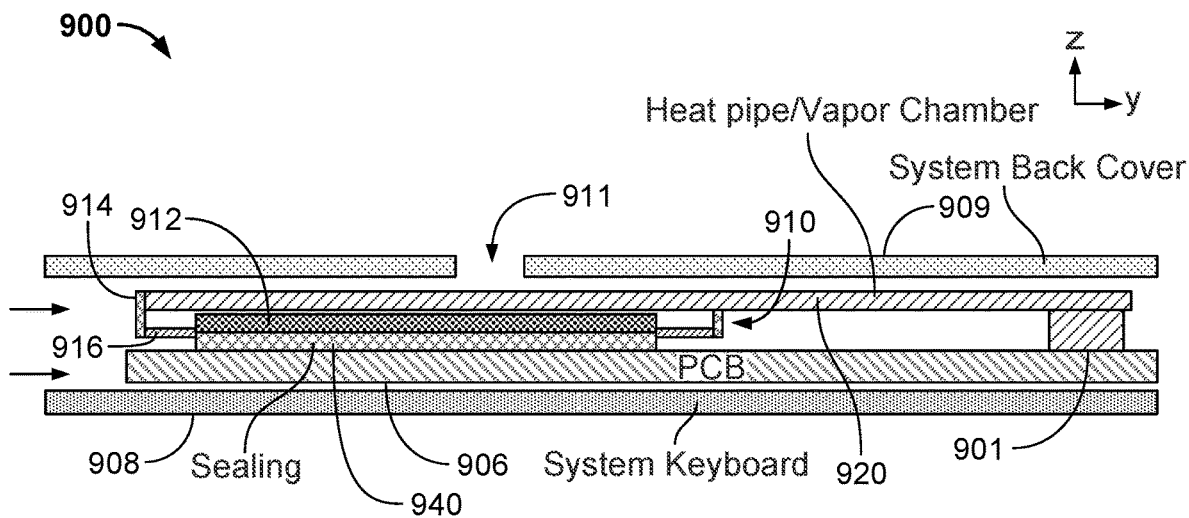

FIGS. 9A-9B depict an embodiment of active cooling system 900 that utilizes a heat sink and is offset from a heat-generating structure. FIG. 9A depicts a plan view of cooling system 900, while FIG. 9B depicts a cross-sectional view of cooling system 900. FIGS. 9A-9B are not to scale and for clarity, only some structures are shown. The device with which cooling system 900 is used may be a laptop computer, a tablet or notebook computer, a smart phone, a server in a rack, a game console, a desktop computer, and/or another device. In some embodiments, therefore, the device is thin. For example, in some embodiments, the device has a thickness (height along the smallest dimension, the z-direction in FIG. 9) analogous to those discussed herein. The flow of fluid in FIGS. 9A-9B is indicated by unlabeled arrows. Thus, fluid flows into MEMS cooling system 910 in the y-direction and exits in the x-direction.

The device into which cooling system 900 is integrated includes heat-generating structure 901 that is analogous to heat-generating structure(s) 401, 501, 601, 701 and/or 801. Also shown are substrate 906 (e.g. a PCB), system back cover 907 (e.g. which may be at the rear of the device facing away from the user), back cover 909 (e.g. which may be proximate to a table or other structure supporting the device), and system front/keyboard 908. In other embodiments, other and/or additional components may be included. Further, heat-generating structure 901 is mounted and/or thermally coupled to heat spreader 920. Thus, heat-generating structure 901 is a component that is desired to be cooled and which may rise significantly in temperature during use. For example, for heat-generating structure 901 may have temperatures in the ranges described with respect to heat-generating structure(s) 401 and/or 501. Other components (not shown) may also generate heat.

Cooling system 900 is analogous to cooling system(s) 400, 500, 600, and/or 800 and functions in an analogous manner. Thus, cooling system 900 includes MEMS cooling system 910 and heat spreader 920 that are analogous to MEMS cooling system(s) 410, 510, 610 and/or 810 and heat spreader 420, 520, 620, and/or 820. MEMS cooling system 910 includes one or more cooling cells (generically indicated by 912) analogous to cooling systems 100 and/or 200. In some embodiments, MEMS cooling system 910 may include one or more tiles 300, each of which includes multiple cooling cells. Cooling cells 912 include cooling element(s) (not shown) configured to undergo vibrational motion when actuated to drive a fluid. The cooling elements are considered to be fluidically connected with heat spreader 920. Cooling cells 912 may also include top plate(s), anchor(s), orifice plate(s), and/or pedestal(s) analogous to those described in the context of cooling system 100 and/or 200. MEMS cooling system 910 thus includes integrated surrounding structure 914 (which includes a cover 916 and fencing) and may include an integrated heat spreader (not explicitly shown) analogous to those described in the context of tile 300. MEMS cooling system 910 may have a thickness of not more than three millimeters. In some embodiments, MEMS cooling system 910 has a thickness of not more than 2.5 millimeters. MEMS cooling system 910 may have a thickness of not more than two millimeters. MEMS cooling system 910 is also coupled to substrate 906 via sealing 940, which prevents flow in the region of sealing 940.

MEMS cooling system 910 is thermally coupled with heat spreader 920. In some embodiments, cooling cells 912 may be physically connected to heat spreader 920, for example via a thermally conductive epoxy or analogous material that affixes an integrated heat spreader to heat spreader 920. In some embodiments, cooling cells 912 are fluidically coupled to heat spreader 920. Fluid driven by cooling elements in cooling system cells 912 remove heat from integrated heat spreader 922 and thus from heat spreader 920 and MEMS cooling system 910. As such, MEMS cooling system 910 and the cooling elements therein may be considered to be fluidically and thermally connected to heat spreader 920. MEMS cooling system 910 is offset from heat-generating structure 901 in the y-direction. In some embodiments, MEMS cooling system 910 may be offset in the x direction instead of or in addition to the offset in the y-direction. Thus, the cooling element(s) of MEMS cooling system 910 undergo vibrational motion when actuated to drive a fluid toward heat spreader 920 while not directing the fluid directly at heat-generating structure 901.

Heat spreader 920 may be a heat spreader, vapor chamber (or heat pipe), heat sink, and/or other component that is thermally coupled to heat-generating structure 901 and transfers heat from heat-generating structure 901. Although shown as being in physical contact with heat-generating structure 901, in some embodiments, heat spreader 920 may be thermally connected to heat-generating structure 901 via a thermal interface material and/or other conductor of heat. In some embodiments, heat spreader 920 is thermally connected to heat-generating structure 901in another manner. Thus, heat produced by heat-generating structure 901 is readily transferred to heat spreader 920. Further, heat spreader 920 includes a vertical offset (in the z-direction). Thus, MEMS cooling system 910 may be considered to be recessed from the top of the portion of heat spreader 920 coupled to heat-generating structure 901.

Cooling system 900 may share some or all the benefits of cooling system(s) 400, 500, 600, 700A, 700B, 700C, and/or 800. MEMS cooling system 910 may provide efficient cooling in a low-profile package. MEMS cooling system 910 is thin (e.g. MEMS cooling system 910 is not more than three millimeters thick). Thus, cooling system 900 may be used in confined spaces and thin devices. Further, heat spreader 920 has a vertical offset. This vertical offset may further reduce the profile of cooling system 900. Thus, cooling system 900, its location in the device, and the device itself may be configured to allow the device to remain thin.

Because heat-generating structure 901 and/or other components may be better cooled, performance may be improved. Further, entrainment may be incorporated to provide a higher flow, greater cooling, and cooler exhaust. Thus, performance of devices incorporating cooling system 900 may be improved.

Figure 10A:
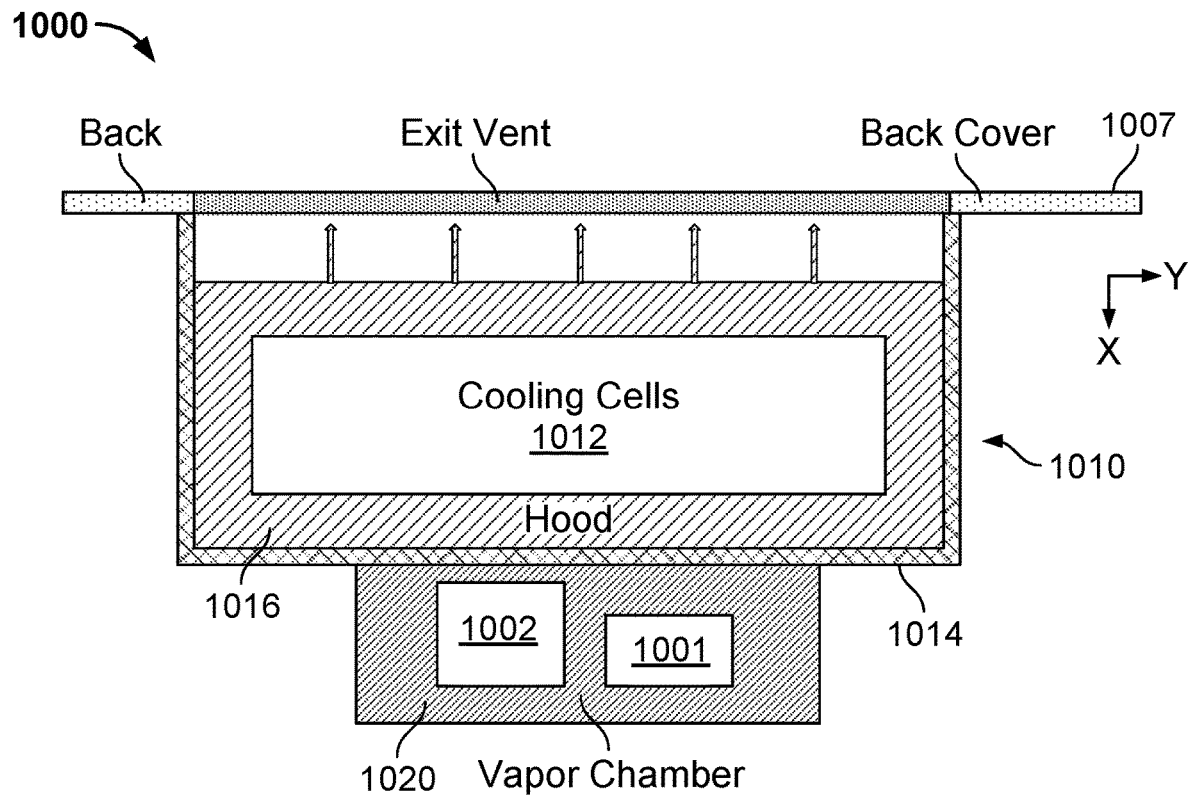
FIGS. 10A-10B depict an embodiment of an active cooling system that utilizes a heat sink and is offset from a heat-generating structure.
Figure 10B:
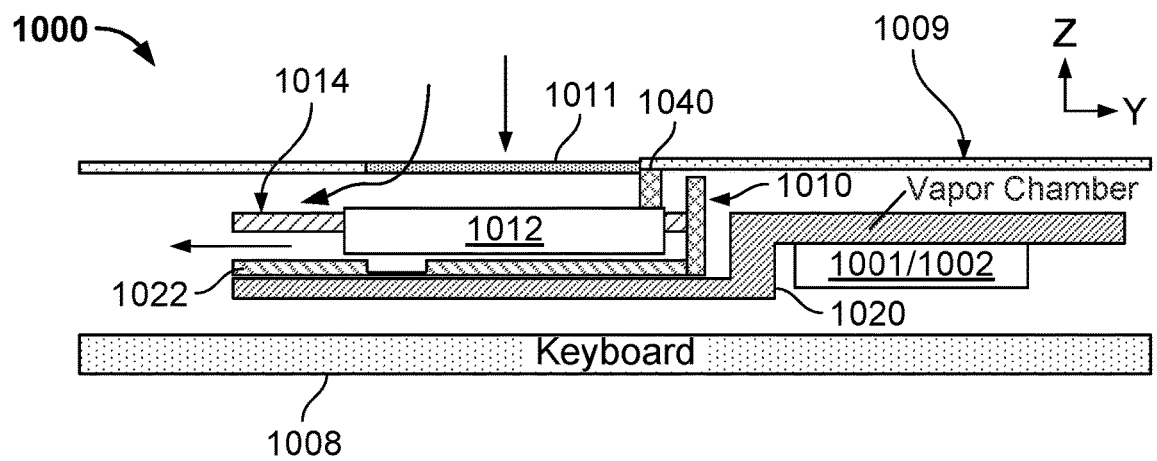

FIGS. 10A-10B depict an embodiment of active cooling system 1000 that utilizes a heat sink and is offset from a heat-generating structure. FIG. 10A depicts a plan view of cooling system 1000, while FIG. 10B depicts a cross-sectional view of cooling system 1000. FIGS. 10A-10B are not to scale and for clarity, only some structures are shown. The device with which cooling system 1000 is used may be a laptop computer, a tablet or notebook computer, a smart phone, a server in a rack, a game console, a desktop computer, and/or another device. In some embodiments, therefore, the device is thin. For example, in some embodiments, the device has a thickness (height along the smallest dimension, the z-direction in FIG. 10) analogous to those discussed herein. The flow of fluid in FIGS. 10A-10B is indicated by unlabeled arrows. Thus, fluid flows into MEMS cooling system 1010 in the y-direction and exits in the x-direction.

The device into which cooling system 1000 is integrated includes heat-generating structures 1001 and 1002 that are analogous to heat-generating structure(s) 401, 501, 601, 701, 801 and/or 901. For example, heat-generating structure 1001 may be a processor such as a central processing unit, while heat-generating structure 1002 may be a graphics processing unit. Also shown are system back cover 1007 (e.g. which may be at the rear of the device facing away from the user), back cover 1009 (e.g. which may be proximate to a table or other structure supporting the device), and system front/keyboard 1008. In other embodiments, other and/or additional components may be included. Further, heat-generating structures 1001 and 1002 are mounted and/or thermally coupled to heat spreader 1020. Thus, heat-generating structure 1001 is a component that is desired to be cooled and which may rise significantly in temperature during use. For example, for heat-generating structure 1001 may have temperatures in the ranges described with respect to heat-generating structure(s) 401 and/or 501. Other components (not shown) may also generate heat.

Cooling system 1000 is analogous to cooling system(s) 400, 500, 600, 800, and/or 900 and functions in an analogous manner. Thus, cooling system 1000 includes MEMS cooling system 1010 and heat spreader 1020 that are analogous to MEMS cooling system(s) 410, 510, 610, 810 and/or 910 and heat spreader 420, 520, 620, 820, and/or 920. MEMS cooling system 1010 includes one or more cooling cells (generically indicated by 1012) analogous to cooling systems 100 and/or 200. In some embodiments, MEMS cooling system 1010 may include one or more tiles 300, each of which includes multiple cooling cells. Cooling cells 1012 include cooling element(s) (not shown) configured to undergo vibrational motion when actuated to drive a fluid. The cooling elements are considered to be fluidically connected with heat spreader 1020. Cooling cells 1012 may also include top plate(s), anchor(s), orifice plate(s), and/or pedestal(s) analogous to those described in the context of cooling system 100 and/or 200. MEMS cooling system 1010 thus includes integrated surrounding structure 1014 (which includes a cover and fencing) and integrated heat spreader 1022 analogous to those described in the context of tile 300. MEMS cooling system 1010 may have a thickness of not more than three millimeters. In some embodiments, MEMS cooling system 1010 has a thickness of not more than 2.5 millimeters. MEMS cooling system 1010 may have a thickness of not more than two millimeters. MEMS cooling system 1010 is also coupled cover 1009 via sealing 1040, which prevents flow from exiting in the region of sealing 1040.

MEMS cooling system 1010 is thermally coupled with heat spreader 1020. In some embodiments, cooling cells 1012 may be physically connected to heat spreader 1020, for example via a thermally conductive epoxy or analogous material that affixes integrated heat spreader 1022 to heat spreader 1020. Fluid driven by cooling elements in cooling system cells 1012 remove heat from integrated heat spreader 1022 and thus from heat spreader 1020 and MEMS cooling system 1010. As such, MEMS cooling system 1010 and the cooling elements therein may be considered to be fluidically and thermally connected to heat spreader 1020. MEMS cooling system 1010 is offset from heat-generating structure 1001 in the y-direction. In some embodiments, MEMS cooling system 1010 may be offset in the x direction instead of or in addition to the offset in the y-direction. Thus, the cooling element(s) of MEMS cooling system 1010 undergo vibrational motion when actuated to drive a fluid toward heat spreader 1020 while not directing the fluid directly at heat-generating structure 1001.

Heat spreader 1020 may be a heat spreader, vapor chamber (or heat pipe), heat sink, and/or other component that is thermally coupled to heat-generating structure 1001 and transfers heat from heat-generating structure 1001. Although shown as being in physical contact with heat-generating structure 1001, in some embodiments, heat spreader 1020 may be thermally connected to heat-generating structure 1001 via a thermal interface material and/or other conductor of heat. In some embodiments, heat spreader 1020 is thermally connected to heat-generating structure 1001 in another manner. Thus, heat produced by heat-generating structure 1001 is readily transferred to heat spreader 1020. Further, heat spreader 1020 includes a vertical offset (in the z-direction). Thus, MEMS cooling system 1010 may be considered to be recessed from the top of the portion of heat spreader 1020 coupled to heat-generating structure 1001.

Cooling system 1000 may share some or all the benefits of cooling system(s) 400, 500, 600, 700A, 700B, 700C, 800, and/or 900. MEMS cooling system 1010 may provide efficient cooling in a low-profile package. MEMS cooling system 1010 is thin (e.g. MEMS cooling system 1010 is not more than three millimeters thick). Thus, cooling system 1000 may be used in confined spaces and thin devices. Further, heat spreader 1020 has a vertical offset. This vertical offset may further reduce the profile of cooling system 1000. Thus, cooling system 1000, its location in the device, and the device itself may be configured to allow the device to remain thin. Because heat-generating structure 1001 and/or other components may be better cooled, performance may be improved. Further, entrainment may be incorporated to provide a higher flow, greater cooling, and cooler exhaust. Thus, performance of devices incorporating cooling system 1000 may be improved.

Figure 11:
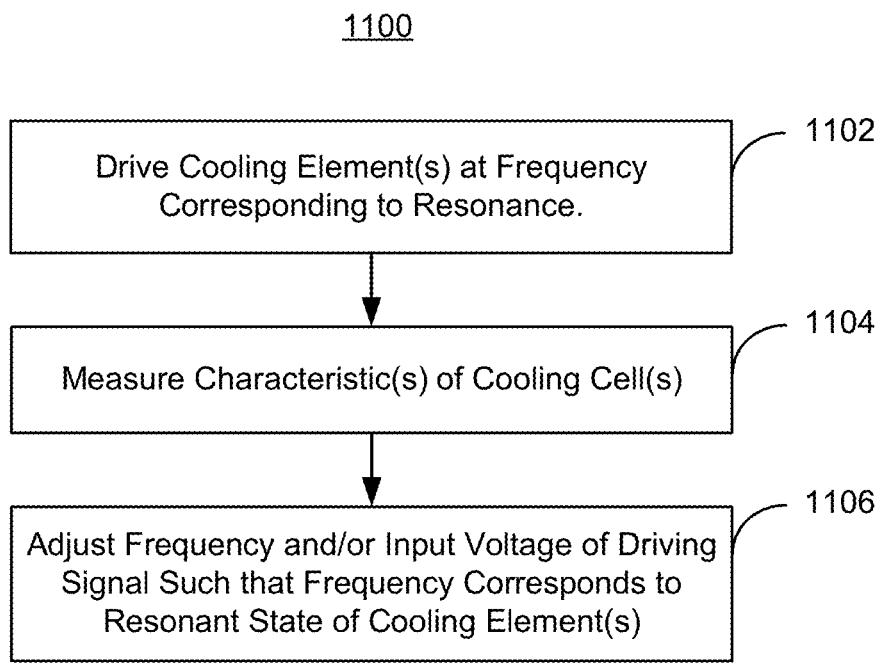
FIG. 11 depicts an embodiment of a method for using an active cooling system that utilizes a heat sink and is offset from a heat-generating structure.

FIG. 11 depicts an embodiment of method 1100 for using an active cooling system that utilizes a heat sink and is offset from the heat-generating structure. Method 1100 may include steps that are not depicted for simplicity. Method 1100 is described in the context of system 400. However, method 1100 may be used with other cooling systems including but not limited to systems and cells described herein.

A driving signal at a frequency and an input voltage corresponding to the resonant state of one or more cooling elements is provided to the active MEMS cooling system, at 1102. In some embodiments, a driving signal having the frequency corresponding to the resonant frequency of a specific cooling element is provided to that cooling element. In some embodiments, a driving signal is provided to multiple cooling elements. In such embodiments, the frequency of the driving signal corresponds to the resonant state of one or more cooling elements being driven, a statistical measure of the resonance, and/or within a threshold of the resonance as discussed above. The MEMS cooling system utilized with a heat spreader and is offset from the heat-generating structure. Thus, driving the MEMS cooling system at 1102 may cool the heat-generating structure by cooling the heat spreader, which is heated by heat transferred from the heat-generating structure.

Characteristic(s) of the MEMS cooling system are monitored while the cooling element(s) are driven to provide a feedback signal corresponding to a proximity to a resonant state of the cooling element(s), at 1104. In some embodiments, characteristic(s) of each individual cooling element are monitored to determine the deviation of the frequency of vibration for that cooling element from the resonant frequency of that cooling element. In some embodiments, characteristic(s) for multiple cooling elements are monitored at 1104. The characteristic(s) monitored may be a proxy for resonance and/or a deviation therefrom. For example, the voltage at the cooling element, the power drawn by the cooling element, power output by the power source, peak-to-peak current output by the power source, peak voltage output by the power source, average current output by the power source, RMS current output by the power source, average voltage output by the power source, amplitude of displacement of the at least one cooling element, RMS current through the cooling element, peak voltage at the cooling element, average current through the at cooling element, average voltage at the at least one cooling element, and/or the peak current drawn by the cooling element may be monitored. Using the characteristic(s) monitored, a deviation from the resonant state of the cooling element (e.g. of the driving/vibration frequency the deviation from the resonant frequency) may be determined.

The frequency and/or input voltage is adjusted based on the feedback signal, at 1106. More specifically, 1106 includes updating the frequency and/or input voltage, based on the feedback signal, to correspond to resonant state(s) of the cooling element(s) at 1106. For example, the frequency for the drive signal may be updated to more closely match the resonant frequency/frequencies. In some embodiments, updating the frequency includes changing the frequency to correspond to a power drawn corresponding to the vibration of the cooling element(s) being maximized, a voltage provided at the cooling element(s) being maximized, a voltage across the cooling element(s) being minimized, and/or an amplitude of a current drawn by the at least one cooling element being minimized. In some embodiments, 1106 includes determining whether the feedback signal indicates that a drift in the resonant frequency of the cooling element(s) exceeds a threshold and identifying a new frequency in response to a determination that the drift exceeds the threshold. The new frequency accounts for the drift in the resonant frequency. The method also includes setting the new frequency as the frequency for the driving signal in response to the new frequency being identified.

For example, cooling elements in MEMS cooling system 410 are driven, at 1102. Thus, the cooling elements in MEMS cooling system 410 are driven at a frequency that is at or near resonance for one or more of the cooling elements. Characteristics of the cooling elements within MEMS cooling system 410 are monitored, at 1104. Thus, the drift of the cooling element(s) from resonance may be determined. The frequency may be adjusted based on the monitoring of 1104, at 1106. Thus, MEMS cooling system 410 may be kept at or near resonance.

Thus, using method 1100, an active cooling system, such as cooling system(s) 100, 200, 300, 410, 510, 610, 710A, 710B, 710C, and 710D, 810, 910, and/or 1010 may be efficiently driven. These cooling systems are offset from the heat-generating structure(s), but may still efficiently cool the heat-generating structure(s). Moreover, these cooling systems may entrain fluid, which can be used to cool other components and/or the exhaust that egresses from the devices. Further, because the characteristic(s) of the MEMS cooling system are monitored, drifts in the resonant frequency may be discovered and accounted for. Thus, method 1100 may be used to operate active MEMS cooling systems and achieve the benefits described herein.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A cooling system, comprising:
   a first heat spreader and a second heat spreader thermally coupled with a heat-generating structure, wherein the first heat spreader and the second heat spreader are thermally connected to the heat-generating structure in series, wherein the first heat spreader and the second heat spreader constitute a heat spreading structure;
   a cooling element in fluid communication with the first heat spreader and the second heat spreader, the heat-generating structure being offset from the cooling element; and
   an orifice plate having at least one orifice therein, the orifice plate being disposed between the cooling element and the heat-generating structure, the cooling element being actuated to drive a fluid through the at least one orifice, wherein the cooling element is not in direct contact with the orifice plate;
   wherein one heat spreader of the first heat spreader and the second heat spreader is vertically offset with respect to the heat-generating structure in a cross-sectional view;
   wherein the one heat spreader is thermally connected to the heat-generating structure via a thermal interface material or another heat conductor;
   wherein the cooling element is located on one side of the heat spreading structure;
   wherein the heat-generating structure is located on another side of the heat spreading structure; and
   wherein the cooling element undergoes vibrational motion when actuated to drive the fluid toward the first heat spreader and the second heat spreader.

2. The cooling system of claim 1, further comprising:
   a support structure;
   wherein the cooling element has a central region and a perimeter, the cooling element being supported by the support structure at the central region, at least a portion of the perimeter being unpinned.

3. The cooling system of claim 1, wherein the first heat spreader, the second heat spreader, and the cooling element have a combined thickness of less than three millimeters.

4. The cooling system of claim 3, wherein the first heat spreader, the second heat spreader, and the cooling element have a combined thickness of less than two millimeters.

5. The cooling system of claim 1, further comprising:
a top plate having at least one vent therein, the cooling element being between the top plate and the first heat spreader and between the top plate and the second heat spreader, forming a top chamber between the cooling element and the top plate.

6. The cooling system of claim 5, wherein the top chamber has a length corresponding to an odd integer multiplied by a wavelength divided by four, the wavelength being an acoustic wavelength for a frequency of the vibrational motion, the frequency of the vibrational motion corresponding to a structural resonance for the cooling element.

7. The cooling system of claim 1, wherein the first heat spreader and the second heat spreader are in different horizontal planes in a cross-sectional view.

8. The cooling system of claim 1, wherein the orifice plate and the cooling element are separated by a support structure.

9. A system, comprising:
a first heat spreader and a second heat spreader thermally coupled with a heat-generating structure, wherein the first heat spreader and the second heat spreader are thermally connected to the heat-generating structure in series, wherein the first heat spreader and the second heat spreader constitute a heat spreading structure; and
an active cooling system including a plurality of active cooling cells, each of the plurality of active cooling cells including a cooling element, the active cooling system being in thermal communication with the with the first heat spreader and the second heat spreader, wherein the cooling element undergoes vibrational motion when actuated to drive a fluid toward the first heat spreader and the second heat spreader, a combined thickness of the first heat spreader, the second heat spreader, and the active cooling system not exceeding four millimeters, the heat-generating structure being offset from the active cooling system, wherein one heat spreader of the first heat spreader and the second heat spreader is vertically offset with respect to the heat-generating structure in a cross-sectional view, wherein the one heat spreader is thermally connected to the heat-generating structure via a thermal interface material or another heat conductor, wherein the cooling element is located on one side of the heat spreading structure, wherein the heat-generating structure is located on another side of the heat spreading structure, and wherein each of the plurality of active cooling cells further includes an orifice plate having at least one orifice therein, the orifice plate being disposed between the cooling element and the heat-generating structure, the cooling element being actuated to drive the fluid through the at least one orifice, wherein the cooling element is not in direct contact with the orifice plate.

10. The system of claim 9, wherein each of the plurality of active cooling cells further includes:
a support structure;
wherein the cooling element has a central region and a perimeter, the cooling element being supported by the support structure at the central region, at least a portion of the perimeter being unpinned.

11. The system of claim 9, wherein the combined thickness of the first heat spreader, the second heat spreader, and the active cooling system is less than three millimeters.

12. The system of claim 11, wherein the combined thickness of the first heat spreader, the second heat spreader, and the active cooling system is less than two millimeters.

13. The system of claim 9, wherein each of the plurality of active cooling cells further includes:
a top plate having at least one vent therein, the cooling element being between the top plate and the first heat spreader and between the top plate and the second heat spreader, forming a top chamber between the cooling element and the top plate.

14. The system of claim 13, wherein the top chamber has a length corresponding to an odd integer multiplied by a wavelength divided by four, the wavelength being an acoustic wavelength for a frequency of the vibrational motion, the frequency of the vibrational motion corresponding to a structural resonance for the cooling element.

15. A method, comprising:
driving a cooling element to induce a vibrational motion at a frequency, the vibrational motion driving a fluid toward a first heat spreader and a second heat spreader, wherein the first heat spreader and the second heat spreader are in thermal communication with a heat-generating structure, wherein the first heat spreader and the second heat spreader are thermally connected to the heat-generating structure in series, wherein the first heat spreader and the second heat spreader constitute a heat spreading structure, wherein the cooling element is actuated to drive the fluid through at least one orifice of an orifice plate, the orifice plate having the at least one orifice therein, the orifice plate being disposed between the cooling element and the heat-generating structure, wherein the cooling element is not in direct contact with the orifice plate; and
wherein one heat spreader of the first heat spreader and the second heat spreader is vertically offset with respect to the heat-generating structure in a cross-sectional view;
wherein the one heat spreader is thermally connected to the heat-generating structure via a thermal interface material or another heat conductor;
wherein the cooling element is located on one side of the heat spreading structure;
wherein the heat-generating structure is located on another side of the heat spreading structure; and
wherein the heat-generating structure is offset from the cooling element.

16. The method of claim 15, wherein the frequency corresponds to a structural resonant frequency of the cooling element and an acoustic resonant frequency for the cooling element.

17. The method of claim 15, wherein the cooling element is part of a cooling system further including:
a support structure;
wherein the cooling element has a central region and a perimeter, the cooling element being supported by the support structure at the central region, at least a portion of the perimeter being unpinned.

18. The method of claim 15, wherein the first heat spreader, the second heat spreader, and the cooling element have a combined thickness of less than three millimeters.

19. The method of claim 18, wherein the first heat spreader, the second heat spreader, and the cooling element have a combined thickness of less than two millimeters.

* * * * *